United States Patent
Sasaki

(10) Patent No.: US 7,107,999 B2
(45) Date of Patent: *Sep. 19, 2006

(54) SUBSTRATE PROCESSING APPARATUS FOR REMOVING ORGANIC MATTER BY REMOVAL LIQUID

(75) Inventor: Tadashi Sasaki, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 265 days.

This patent is subject to a terminal disclaimer.

(21) Appl. No.: 10/256,119

(22) Filed: Sep. 25, 2002

(65) Prior Publication Data

US 2003/0066797 A1 Apr. 10, 2003

(30) Foreign Application Priority Data

Sep. 27, 2001 (JP) ............................ P2001-296271
Aug. 27, 2002 (JP) ............................ P2002-247212

(51) Int. Cl.
*B08B 3/04* (2006.01)
*F26B 19/00* (2006.01)

(52) U.S. Cl. ........................ 134/66; 134/153; 134/902; 34/60

(58) Field of Classification Search ................ 134/902, 134/61, 66, 76, 144, 149, 151, 184, 198; 15/77
See application file for complete search history.

(56) References Cited

U.S. PATENT DOCUMENTS

| | | | | |
|---|---|---|---|---|
| 5,445,171 A * | 8/1995 | Ohmori et al. | ............... | 134/61 |
| 5,701,627 A * | 12/1997 | Matsumura et al. | ......... | 15/88.2 |
| 6,245,156 B1 * | 6/2001 | Taniyama et al. | .............. | 134/6 |
| 6,457,199 B1 * | 10/2002 | Frost et al. | .................... | 15/77 |
| 6,550,988 B1 * | 4/2003 | Sugimoto et al. | ........... | 396/564 |

* cited by examiner

*Primary Examiner*—Joseph L. Perrin
(74) *Attorney, Agent, or Firm*—Ostrolenk, Faber, Gerb & Soffen, LLP

(57) ABSTRACT

An indexer part, removal processing part, interface, and dry processing part are disposed adjacent to each other in a row. That is, the removal processing part that performs removal processing of an organic matter by using a removal liquid is disposed adjacent to the indexer part loading and unloading a substrate with respect to the exterior of an apparatus. The interface that gives and receives a substrate between the removal processing part and dry processing part is interposed between the removal processing part and the dry processing part that performs dry processing of a substrate after passing through the removal processing. This enables to provide a substrate processing apparatus that can completely dry the substrate after a reaction product removal processing.

17 Claims, 13 Drawing Sheets

FIG. 9
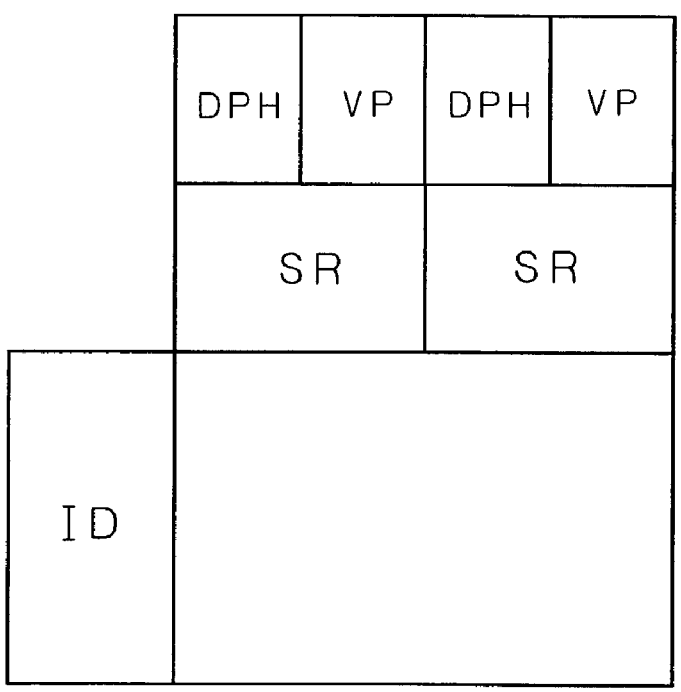
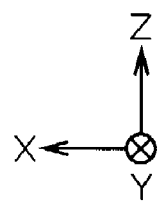

SUBSTRATE PROCESSING APPARATUS FOR REMOVING ORGANIC MATTER BY REMOVAL LIQUID

BACKGROUND OF THE INVENTION

1. Field of the Invention

The present invention relates to a substrate processing apparatus that removes by a removal liquid an organic matter attached to a semiconductor substrate, a grass substrate for liquid crystal display, a grass substrate for photomask, and a substrate for optical disk (hereinafter referred to simply as a "substrate"). Included in such organic matter is polymer that is formed by subjecting a thin film existing on the substrate surface to dry etching using a resist film as a mask.

2. Description of the Background Art

The manufacturing process of a semiconductor device includes the step in which a thin film of metal such as aluminum or copper (a metal film) formed on a substrate such as a semiconductor wafer is etched by using a patterned resist film as a mask, thereby to obtain wiring of the semiconductor device.

This etching step is executed for example by dry etching such as RIE (reactive ion etching).

Since the power of reactive ions used in the above dry etching is extremely strong, the resist film is changed at a constant rate when the metal film etching is terminated. As a result, part of the resist film is changed to a reaction product such as polymer and deposited on the sidewall of the metal film. This reaction product cannot be removed in a subsequent resist removal step. It is therefore necessary to remove this reaction product before or after executing the resist removal step.

Conventionally, to remove a reaction product deposited on the sidewall of a metal film, a removal liquid that functions to remove the reaction product is supplied to a substrate after dry etching step or after resist removal step. Thereafter, the substrate is washed with deionized water, and the deionized water is dried by spinning.

In the meantime, due to the recent pattern miniaturization, the deionized water attached to a substrate might not be removed satisfactorily only by drying it spinning. If the deionized water remains on the substrate, there is a fear that the remaining deionized water is reacted with a thin film, air compositions, and contaminants in the air, thereby forming new contaminant.

Hence, if there is a process of supplying deionized water to a substrate, it is necessary to completely dry the substrate.

Particularly when deionized water remains on the substrate after the reaction product removal processing, a metal thin film part is often present on the substrate surface. This causes the problem that unnecessary oxide is formed by the reaction of the metal with the deionized water. Further, when this substrate is transported to a processing under vacuum, e.g., CVD, the deionized water attached to the substrate can adversely affect the processing.

SUMMARY OF THE INVENTION

The present invention is directed to a substrate processing apparatus that removes an organic matter attached to a substrate by a removal liquid for the organic matter.

According to the present invention, a substrate processing apparatus includes: an indexer part that mounts a cassette encasing a substrate and that loads and unloads a substrate with respect to the exterior of the apparatus; a removal processing part that performs a removal processing of an organic matter by the removal liquid and is disposed adjacent to the indexer part; a dry processing part for performing a dry processing of a substrate after passing through the removal processing; and an interface that is disposed so as to be sandwiched between the removal processing part and the dry processing part, and that gives and receives a substrate between the removal processing part and the dry processing part.

The removal processing part and dry processing part can be incorporated into one apparatus, and the substrate can be completely dried after an organic matter removal processing.

According to one aspect of the present invention, a substrate processing apparatus includes: an indexer part that mounts a cassette encasing a substrate and that loads and unloads a substrate with respect to the exterior of the apparatus; a removal processing part that performs a removal processing of an organic matter by the removal liquid and is disposed adjacent to the indexer part; a dry processing part for performing a dry processing of a substrate after passing through the removal processing; and an interface that is disposed so as to be sandwiched between the removal processing part and the dry processing part, and that gives and receives a substrate between the removal processing part and the dry processing part, wherein the removal processing part includes: (i) a first transport path, one end of which is in contact with the indexer part and the other end is in contact with the interface; (ii) a plurality of removal processing units surrounding the first transport path and removing an organic matter attached to a substrate by supplying the removal liquid to the substrate while rotating the substrate; and (iii) a first transport robot being disposed on the first transport path and transporting a substrate among the indexer part, the interface, and the plurality of removal processing units, and the dry processing part includes: (iv) a second transport path, one end of which is in contact with the interface; (v) a plurality of dry processing units surrounding the second transport path and drying a substrate; and (vi) a second transport robot being disposed on the transport path and transporting a substrate among the interface and the plurality of dry processing units.

The removal processing unit and dry processing unit can be efficiently incorporated into a single apparatus, and the substrate can be completely dried after an organic matter removal processing.

According to other aspect of the present invention, a substrate processing apparatus includes: an indexer part that mounts a cassette encasing a substrate and that loads and unloads a substrate with respect to the exterior of the apparatus; a transport path, one end of which is in contact with the indexer part; a plurality of removal processing units surrounding the transport path and removing an organic matter attached to a substrate by supplying the removal liquid to the substrate while rotating the substrate; a plurality of dry processing units surrounding the transport path and drying a substrate; and a transport robot being disposed on the transport path and transporting a substrate among the indexer part, the plurality of removal processing units, and the plurality of dry processing units.

The removal processing unit and dry processing unit can be incorporated efficiently into one apparatus, and the substrate can be completely dried after an organic matter removal processing.

According to other aspect of the present invention, a substrate processing apparatus includes: an indexer part that mounts a cassette encasing a substrate and that loads and unloads a substrate with respect to the exterior of the apparatus; a transport path, one end of which is in contact with the indexer part; a plurality of removal processing units surrounding the transport path and removing an organic matter attached to a substrate by supplying the removal liquid to the substrate while rotating the substrate; a plurality of dry processing units surrounding the transport path and drying a substrate; and a transport robot being disposed on the transport path and transporting a substrate among the indexer part, the plurality of removal processing units, and the plurality of dry processing units, wherein the plurality of removal processing units are disposed below the plurality of dry processing units, respectively.

The footprint of the apparatus can be reduced because the removal processing units are disposed below the plurality of dry processing units, respectively.

According to other aspect of the present invention, a substrate processing apparatus includes: a removal processing part formed by disposing in a multistage a plurality of removal processing units for removing an organic matter attached to a substrate by supplying the removal liquid to the substrate while rotating the substrate; a dry processing part formed by disposing in a multistage a plurality of dry processing units for drying a substrate; and a transport robot for transporting a substrate among the plurality of removal processing units and the plurality of dry processing units, wherein the removal processing part and the dry processing part are disposed around the transport robot.

The removal processing unit and dry processing unit can be efficiently incorporated into one apparatus, and the substrate can be completely dried after an organic matter removal processing.

Accordingly, it is an object of the present invention to completely dry a substrate when there is a processing of supplying deionized water to the substrate, and in particular, to completely dry the substrate after a reaction product removal processing.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8 and 9 are diagrams showing the layout of a substrate processing apparatus according to a third preferred embodiment;

DESCRIPTION OF THE PREFERRED EMBODIMENTS

Figure 1:
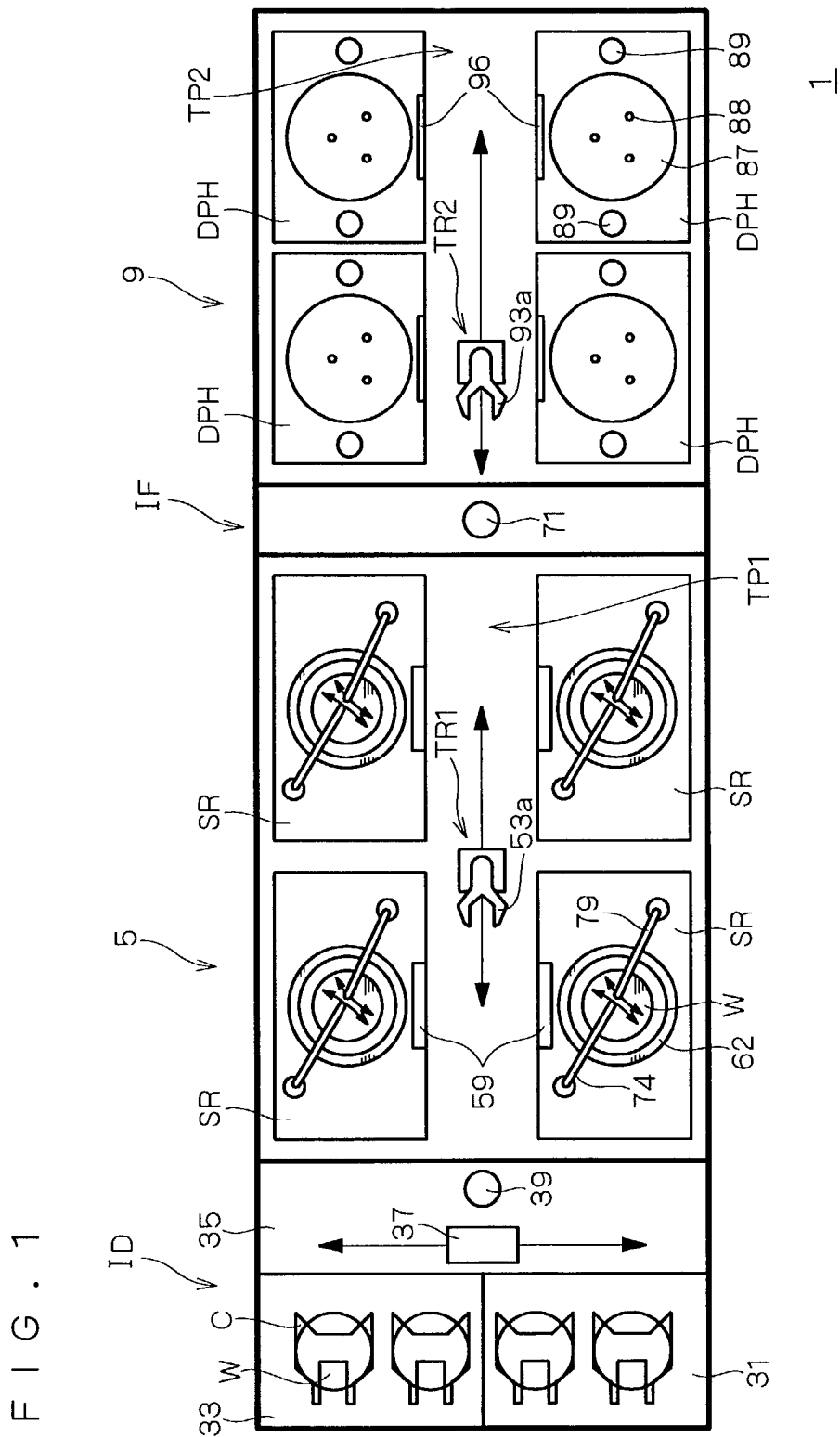
FIG. 1 is a plan view of a substrate processing apparatus according to a first preferred embodiment of the present invention.

In the following preferred embodiments, the term "substrate" means a semiconductor substrate and, more particularly, a silicon substrate. The substrate has a thin film. The thin film is a metal film or insulating film. Examples of the metal constituting the metal film are copper, aluminum, titanium, tungsten, and a mixture of these. Examples of the insulating film are oxide films or nitride films of the above-mentioned metals, silicon oxide film, silicon nitride film, organic insulating film, and low dielectric interlayer insulating film. The term "thin film" used herein means one that in a vertical cross section with respect to a substrate on which a thin film is formed, its height dimension is shorter than its bottom length, as well as one that its height dimension is longer than its bottom length. Therefore, included in such thin film is also one that exists in the shape of a line or island when a substrate is viewed from a direction perpendicular to the main surface of the substrate, such as a film or wiring partially formed on the substrate.

On a substrate after passing through the step of subjecting such thin film to dry etching using a patterned resist film as a mask, polymer that is a reaction product derived from the resist and thin film is formed by the dry etching.

The term "substrate processing" used in the following preferred embodiments means a polymer removal processing for removing polymer from a substrate on which the polymer is so formed.

In the following description, polymer separated from a substrate is expressed as "contaminant" in some cases.

The term "removal liquid" used in the following preferred embodiments means a polymer removal liquid. The polymer removal liquid selectively removes polymer only. For example, there are organic amine removal liquids containing organic amine such as dimethyl sulfoxide and dimethyl formamide; ammonium fluoride removal liquids containing ammonium fluoride; and inorganic removal liquids.

Examples of the organic amine removal liquids are a mixed solution of monoethanolamine, water, and aromatic triol; a mixed solution of 2-(2-aminoethoxy)ethanol, hydroxyamine, and catechol; a mixed solution of alkanolamine, water, dialkyl sulfoxide, hydroxyamine, and amine anticorrosive; a mixed solution of alkanolamine, glycol ether, and water; a mixed solution of dimethyl sulfoxide, hydroxyamine, triethylenetetramine, pyrocatechol, and water; a mixed solution of water, hydroxyamine, and pyrogallol; a mixed solution of 2-aminoethanol, ethers, and sugar alcohols; and a mixed solution of 2-(2-aminoethoxy) ethanol, N-dimethylacetoacetamide, water, and triethanolamine.

Examples of the ammonium fluoride removal liquids are a mixed solution of organic alkali, sugar alcohol, and water; a mixed solution of fluorochemical, organic carboxylic acid, and amide solvent; a mixed solution of alkylamide, water, and ammonium fluoride; a mixed solution of dimethyl sulfoxide, 2-aminoethanol, organic alkali solution, and aromatic hydrocarbon; a mixed solution of dimethyl sulfoxide, ammonium fluoride, and water; a mixed solution of ammonium fluoride, trieanolamine, pentamethyldiethylenetriammine, iminodiacetic acid, and water; a mixed solution of glycol, alkyl sulfate, organic salt, organic acid, and inorganic salt; and a mixed solution of amide, organic salt, organic acid, and inorganic salt.

Example of the inorganic removal liquid is a mixed solution of water and phosphate derivative.

The term "organic solvent" means a hydrophilic organic solvent, i.e., water-soluble organic solvent. Specifically, this solvent can be mixed with water and can decrease the boiling point of the mixture. Hereat it is possible to use ketones such as acetone and diethylketone; ethers such as methyl ether and ethyl ether; and polyhydric alcohol such as ethylene glycol. Taking into consideration that one containing less amount of contaminant such as metal has been widespread in the market, it is most desirable to use isopropyl alcohol (IPA). The following preferred embodiments therefore employ IPA.

1. First Preferred Embodiment 1-1. Overall Construction of Apparatus

A first preferred embodiment of a substrate processing apparatus according to the present invention will be described by referring to the accompanying drawings. FIG. 1 is a plan view of a substrate processing apparatus 1. The apparatus 1 has an indexer part ID, a removal processing part 5, an interface IF, and a dry processing part 9, which are aligned in a row.

The indexer part ID has a loading part 31 on which a carrier (cassette) C encasing an untreated substrate W is mounted, an unloading part 33 on which a carrier C encasing a treated substrate W is mounted, and a delivery part 35.

The loading part 31 has a mounting table, and two carriers C are mounted on the mounting table by a transport mechanism disposed outside of the apparatus. The carrier C holds, for example, 25 substrates W in such a state that they are in a horizontal position and arranged at vertically spaced intervals. The unloading part 33 also has a mounting table, and two carriers C are mounted on the mounting table. The two carriers C are unloaded by a transport mechanism disposed outside of the apparatus.

The delivery part 35 has a first delivery table 39, and a transfer mechanism 37 that moves in a direction in which the carriers C of the loading part 31 and unloading part 33 are aligned, in order to load and unload the substrates W with respect to the carriers C. The transfer mechanism 37 has an indexer arm (not shown). Therefore, in addition to movement in a horizontal direction, the transfer mechanism 37 can perform a rotational action around a vertical direction, and a lifting action in the vertical direction, as well as advance and retraction actions of the indexer arm. By these actions, the transfer mechanism 37 loads and unloads a substrate W with respect to the carriers C, and also gives and receives the substrate W with respect to the first delivery table 39.

The removal processing part 5 is disposed adjacent to the indexer part ID, and has four removal processing units SR and a first transport robot TR1. Each removal processing unit SR encases a substrate W and performs a reaction product removal processing. The first transport robot TR1 gives and receives a substrate W with respect to the first delivery table 39 and a second delivery table 71 to be described later, and also gives and receives a substrate W with respect to the four removal processing units SR.

Two rows of removal processing units SR are disposed apart in a direction in which the carriers C are aligned. Each row is made of two removal processing units SR aligned in a direction orthogonal to the direction in which the carriers C of the indexer part ID are aligned. The first transport robot TR1 is disposed on a first transport path TP1 sandwiched between the two rows of the removal processing units SR.

The first transport robot TR1 traveling on the first transport path TP1 gives and receives a substrate W with respect to each removal processing unit SR and the first delivery table 39. The first transport robot TR1 also gives and receives a substrate W with respect to the second delivery table 71. The removal processing units SR and first transport robot TR1 will be described later in detail.

The interface IF is interposed between the removal processing part 5 and dry processing part 9, and has the second delivery table 71 for mounting a substrate W.

The dry processing part 9 is disposed adjacent to the interface IF and has four dry processing units DPH and a second transport robot TR2. Each dry processing unit DPH encases a substrate W and performs dry processing. The second transport robot TR2 gives and receives a substrate W with respect to the second delivery table 71 and the four dry processing units DPH.

Two rows of dry processing units DPH are disposed apart in the direction in which the carriers C are aligned. Each row is made of two dry processing units DPH aligned in a direction orthogonal to the direction in which the carriers C of the indexer part ID are aligned. The second transport robot TR2 is disposed on a second transport path TP2 sandwiched between the two rows of the dry processing units DPH.

The second transport robot TR2 traveling on the second transport path TP2 gives and receives a substrate W with respect to each dry processing unit DPH and the second delivery table 71. The dry processing units DPH and second transport robot TR2 will be described later in detail.

1-2. Removal Processing Unit

Figure 2:
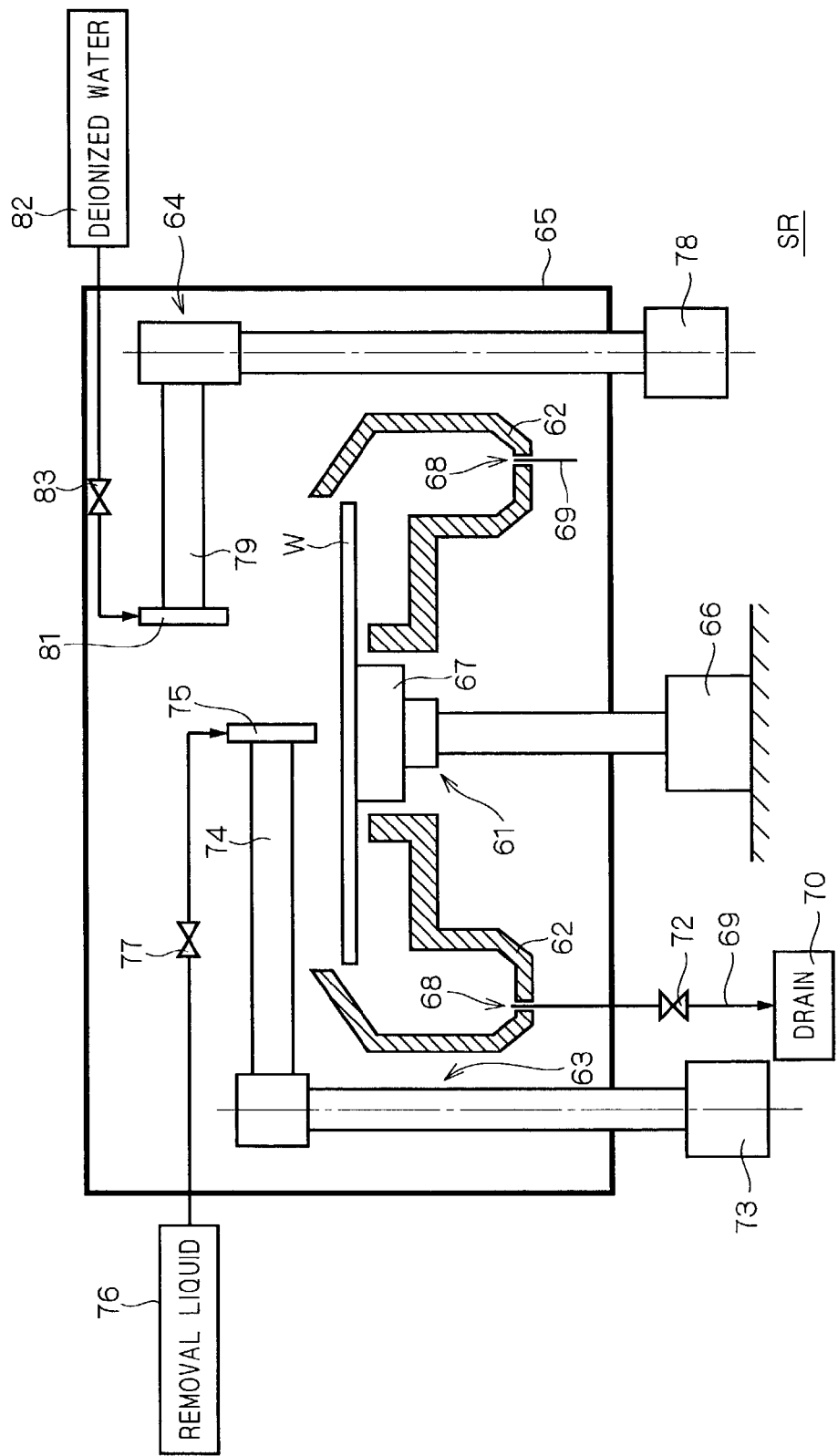
FIG. 2 is a diagram showing the construction of a removal processing unit of the substrate processing apparatus in FIG. 1.

The removal processing unit SR will be further described by referring to FIG. 2, which is a diagram showing the construction of the removal processing unit SR.

The removal processing unit SR has a substrate holding part 61 that rotates while holding a single substrate W in a horizontal position, a cup 62 surrounding the held substrate W, a removal liquid supply part 63 for supplying a removal liquid to the held substrate W, a deionized water supply part 64 for supplying deionized water to the held substrate W, and a chamber 65 for encasing the substrate W held by the substrate holding part 61.

A shutter 59 (see FIG. 1) is disposed in the chamber 65. The shutter 59 is opened when the first transport robot TR1 loads and unloads a substrate W with respect to the chamber 65. The shutter 59 is closed in other times. The chamber 65 is always in an atmospheric state. The atmosphere of the chamber 65 is discharged to an exhaust duct (not shown), which is disposed outside of the apparatus. This prevents that the atmosphere containing the mist and vapor of processing liquid leaks from the chamber 65.

The substrate holding part 61 has a motor 66 disposed outside of the chamber 65, and a chuck 67 that is driven by the motor 66 so as to rotate around a vertically oriented axis.

The cup 62 is of a doughnut-type when viewed from above, and has a centrally located opening through which the chuck 67 can pass. The cup 62 collects the liquid scattering from a substrate W in rotation (e.g., the removal liquid and deionized water) and also discharges the collected liquid from a drainage outlet 68 disposed at the bottom portion of the cup 62. The drainage outlet 68 is provided with a drain pipe 69 extending to a drain 70. A drain valve 72 for opening and closing a pipe line of the drain pipe 69 is interposed on the drain pipe 69. The cup 62 moves up and down by a certain mechanism (not shown).

The removal liquid supply part 63 has a motor 73 disposed outside of the chamber 65, an arm 74 rotated by the rotation of the motor 73, a removal liquid nozzle 75 that is disposed at the tip of the arm 74 and discharges the removal liquid downwardly, and a removal liquid source 76 supplying the removal liquid to the removal liquid nozzle 75. The removal liquid nozzle 75 is connected to the removal liquid source 76 with a pipe line, on which a removal liquid valve 77 is interposed. There is disposed a lifting part (not shown) which lifts and lowers the removal liquid nozzle 75 by lifting and lowering the motor 73.

By driving the motor 73, the removal liquid nozzle 75 moves reciprocally between a discharge position above the center of rotation of the substrate W and a standby position located outside of the cup 62.

The deionized water supply part 64 has a motor 78 disposed outside of the chamber 65, an arm 79 rotated by the rotation of the motor 78, a deionized water nozzle 81 that is disposed at the tip of the arm 79 and discharges deionized water downwardly, and a deionized water source 82 supplying deionized water to the deionized water nozzle 81. The deionized water nozzle 81 is connected to the deionized water source 82 with a pipe line, on which a deionized water valve 83 is interposed. There is disposed a lifting part (not shown) which lifts and lowers the deionized water nozzle 81 by lifting and lowering the motor 78.

By driving the motor 78, the deionized water nozzle 81 moves reciprocally between a discharge position above the center of rotation of the substrate W and a standby position located outside of the cup 62.

With this construction, the removal processing unit SR can remove an organic matter attached to the substrate W by supplying the removal liquid to the substrate W while rotating the substrate W.

1-3. Dry Processing Unit

Figure 3:
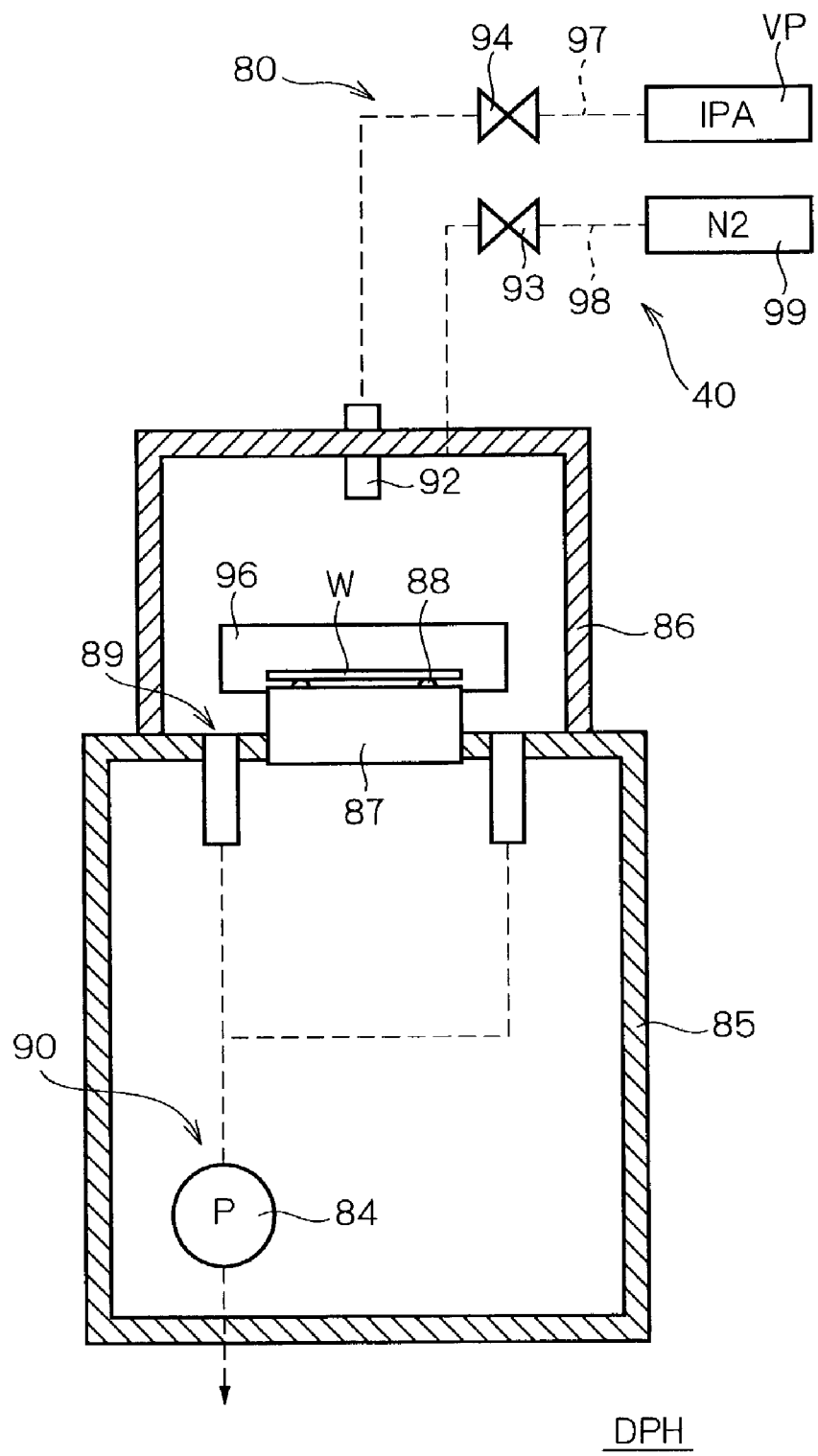
FIG. 3 is a diagram showing the construction of a dry processing unit of the substrate processing apparatus in FIG. 1.

FIG. 3 is a diagram showing the construction of a dry processing unit DPH. The dry processing unit DPH has a sealed chamber 86 that is airtight and disposed above a frame 85, a temperature controlled plate 87 having a temperature control mechanism, an upper part of the plate 87 disposed in the sealed chamber 86, a pressure reduction part 90 for reducing the pressure within the sealed chamber 86, an atmospheric pressure release part 40 for returning the reduced pressure within the sealed chamber 86 to an atmospheric pressure, and a solvent vapor supply part 80 for supplying an organic solvent vapor into the sealed chamber 86. The pressure reduction part 90 has a pump 84 and a pipe line for connecting the pump 84 and the sealed chamber 86.

A shutter 96 is disposed in the sealed chamber 86. The shutter 96 is opened when the second transport robot TR2 loads and unloads a substrate W with respect to the sealed chamber 86, and closed in other times to maintain hermeticity of the sealed chamber 86. An exhaust vent 89 is disposed at the bottom portion of the sealed chamber 86 that is connected to the pump 84 with a pipe line. The pump 84 reduces the pressure within the sealed chamber 86 by exhausting the atmosphere of the sealed chamber 86.

The temperature controlled plate 87 projects in the sealed chamber 86. The temperature controlled plate 87 has in its inside a heating or cooling mechanism for adjusting the temperature of a substrate W. The temperature controlled plate 87 has three pins 88 on which the substrate W is to be placed. These pins 88 ascend when a substrate W is given to and received from the second transport robot TR2, and they descend when a substrate W is subjected to dry processing. When the pins 88 are lowered to perform dry processing, the tops of the pins 88 slightly project from the top surface of the temperature controlled plate 87, thereby leaving a slight gap between the substrate W and the temperature controlled plate 87.

The solvent vapor supply part 80 has a solvent vapor supply nozzle 92 for supplying a solvent vapor (IPA (isopropyl alcohol) is used hereat) into the sealed chamber 86, a solvent vapor generating unit VP for sending a solvent vapor to the solvent vapor supply nozzle 92, and a solvent valve 94 disposed on a solvent pipe line 97 connecting the solvent vapor generating unit VP and solvent vapor supply nozzle 92. The term "solvent vapor" means a mist organic solvent composed of fine droplets and a gaseous organic solvent. Therefore, the solvent vapor generating unit VP includes, as a solvent vapor generating part, (i) an ultrasonic vaporization part that obtains a solvent vapor by applying ultrasonic wave to liquid IPA; (ii) a heat vaporization part that obtains a solvent vapor by heating liquid IPA; and (iii) a bubbling vaporization part that obtains a solvent vapor by passing bubbles of an inert gas (e.g., nitrogen) through liquid IPA.

Connected to the sealed chamber 86 is a gas pipe line 98 extending from an $N_2$ source 99 that is a supply source of an inert gas (nitrogen gas is used here). A gas valve 93 for opening and closing the passage of the gas pipe line 98 is interposed on the gas pipe line 98. The atmospheric pressure release part 40 for returning the reduced pressure within the sealed chamber 86 to an atmospheric pressure has the gas pipe line 98, gas valve 93, and the $N_2$ source 99.

With this construction, the dry processing unit DPH can dry the substrate W under reduced pressure.

1-4. Transport Robots

Description will now be given of the first and second transport robots TR1 and TR2. Although the following description is directed to the first transport robot TR1, the second transport robot TR2 has the same construction and performs the same action.

Figure 4:
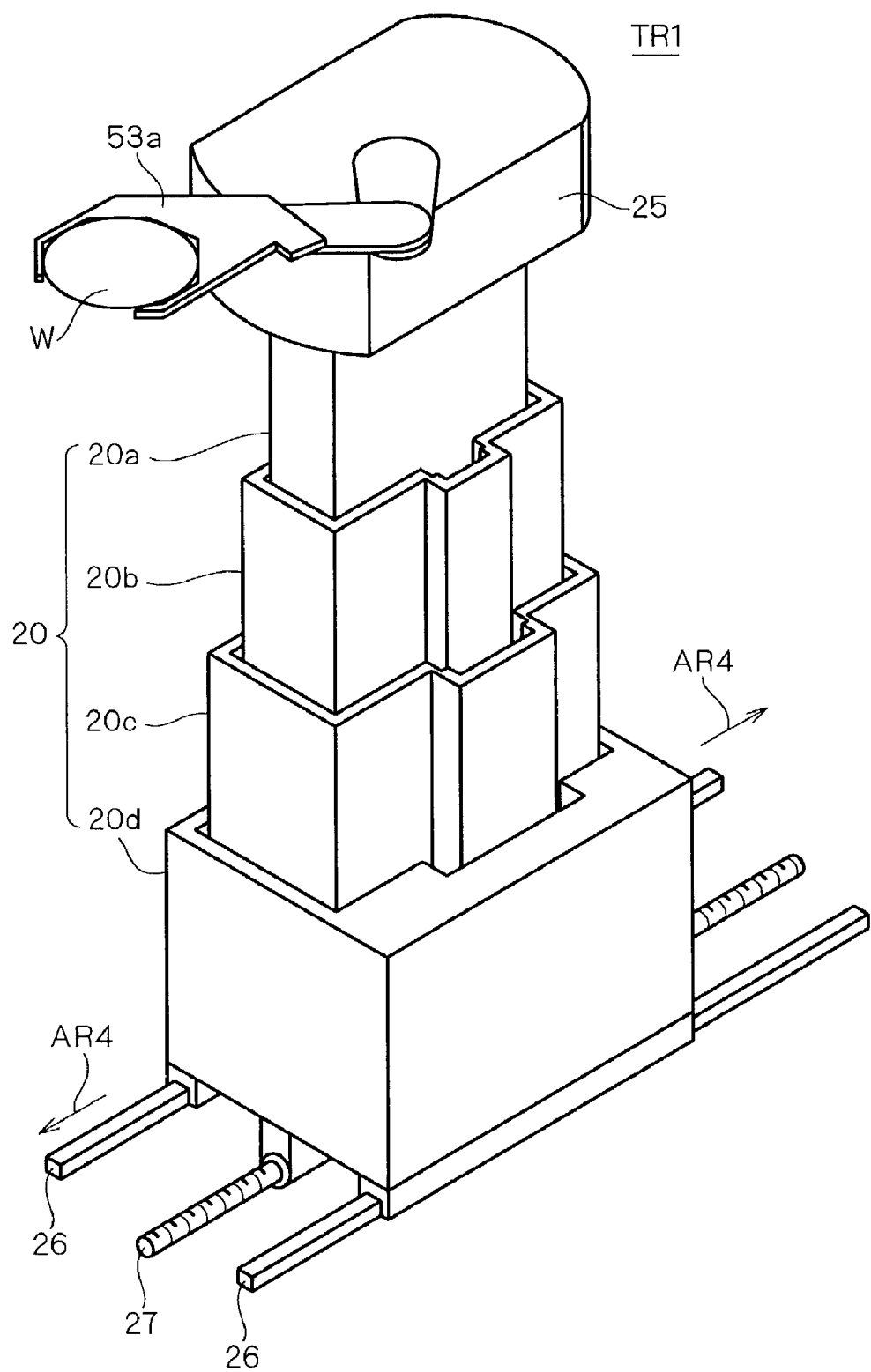
FIG. 4 is a perspective view of the appearance of a transport robot of the substrate processing apparatus in FIG. 1.

FIG. 4 is a perspective view of the appearance of the first transport robot TR1. In the first transport robot TR1, an arm stage 25 with a transport arm 53a is disposed above a telescopic motion body 20. The telescopic motion body 20 realizes a telescopic multistage structure.

The telescopic motion body 20 is made of four segments 20a, 20b, 20c, and 20d, which are arranged in this order from top to bottom. The segment 20a can be encased in the segment 20b, the segment 20b can be encased in the segment 20c, and the segment 20c can be encased in the segment 20d. The telescopic motion body 20 shrinks by sequentially encasing the segments 20a to 20d, and extends by sequentially pulling out the segments 20a to 20d. That is, during shrinkage of the telescopic motion body, the segment 20a is encased in the segment 20b, the segment 20b is encased in the segment 20c, and the segment 20c is encased in the segment 20d. On the other hand, during extension of the telescopic motion body 20, the segment 20a is pulled out of the segment 20b, the segment 20b is pulled out of the segment 20c, and the segment 20c is pulled out of the segment 20d.

The extensible action of the telescopic motion body 20 is realized by an extensible lifting mechanism contained in its inside. As the extensible lifting mechanism, there can be used such a mechanism that a plurality of combinations of belt and roller are driven by a motor. By this extensible lifting mechanism, the first transport robot TR1 can perform a lifting action in a vertical direction of the transport arm 53a.

As shown in the arrows AR4 in FIG. 4, the transport arm 53a of the first transport robot TR1 is movable in a longitudinal direction of the first transport path TP1 of a rectangular shape by a horizontal drive mechanism composed of a male screw 27 and guide rails 26 etc. Specifically, the male screw 27 is rotated by an electric motor (no shown), so that the segment 20d engaged in the male screw 27 slidingly moves in the longitudinal direction of the first transport path TP1.

Further, the first transport robot TR1 can perform horizontal advance and retraction movements and a rotational action of the transport arm 53a. Specifically, an arm stage 25 is disposed above the segment 20a, and the arm stage 25 performs the horizontal advance and retraction movements and rotational action of the transport arm 53a. That is, the arm stage 25 directs the arm segment of the transport arm 53a to fold and extend. Thereby, the transport arm 53a performs the horizontal advance and retraction movements. The arm stage 25 itself performs a rotational action to the telescopic motion body 20, so that the transport arm 53a performs the rotational action.

Therefore, the first transport robot TR1 is possible to lift the transport arm 53a in a height direction, horizontally move the arm 53a in a longitudinal direction of the first transport path TP1, rotate the arm 53a, and advance and retract the arm 53a in a horizontal direction. That is, the first transport robot TR1 can move the transport arm 53a in three dimensions. Thereby, the first transport robot TR1 travels along a space between the rows of removal processing units SR (i.e., the first transport path TP1) and transports a substrate W among the indexer part ID, the interface IF and each removal processing unit SR.

Similarly, the second transport robot TR2 is possible to lift the transport arm 93a (see FIG. 1) in a height direction, horizontally move the arm 93a in a longitudinal direction of the second transport path TP2, rotate the arm 93a, and advance and retract the arm 93a in a horizontal direction. That is, the second transport robot TR2 can move the transport arm 93a in three dimensions. Thereby, the second transport robot TR2 travels along a space between the rows of dry processing units DPH (i.e., the second transport path TP2) and transports a substrate W between the interface IF and each dry processing unit DPH.

1-5. Substrate Processing Method

Following is a substrate processing method using the above-mentioned substrate processing apparatus 1. This method comprises a removal liquid supply step, deionized water supply step, spin-dry step, and drying step as follows.

Firstly, a substrate W encased in the carrier C is transported to the loading part 31. This substrate W has a thin film, and this film has been subjected to dry etching using a patterned resist film as a mask. Therefore, a reaction product (polymer in this case), which is derived from the resist film and thin film, is attached to the substrate W.

By the transfer mechanism 37, the substrate W is taken out of the carrier C of the loading part 31 and placed on the first delivery table 39. The substrate W placed on the first delivery table 39 is taken out by the transport robot TR1 and loaded in one of the four removal processing units SR. In the removal processing unit SR, the shutter 59 is opened so that the substrate W transported by the first robot TR1 is received and held by the chuck 67.

In the removal processing unit SR receiving the substrate W, the substrate holding part 61 holds the substrate W. The drain valve 72 is opened.

The substrate holding part 61 rotates the motor 66 so as to rotate the substrate W. When the substrate W reaches a predetermined number of revolutions, the removal liquid supply step is initiated. In this step, the motor 73 rotates so that the removal liquid nozzle 75 in its standby position moves to the discharge position. The removal liquid valve 77 is then opened to supply a removal liquid from the removal liquid nozzle 75 to the substrate W. The removal liquid supplied to the substrate W falls down to the outside of the substrate W. This removal liquid is collected by the cup 62 and discharged via the drain pipe 69 to the drain 70. After the removal liquid is supplied for a predetermined time, the removal liquid valve 77 is closed and the removal liquid nozzle 75 is returned to the standby position.

In this removal liquid supply step, the removal liquid supplied to the substrate W is reactive to a reaction product on the substrate W thus to facilitate separation of this reaction product from the substrate W. Accordingly, the reaction product is gradually removed from the substrate W by rotation of the substrate W and the removal liquid supply.

Subsequently, the deionized water supply step is performed. In this step, the motor 78 rotates to move the deionized nozzle 81 in its standby position to the discharge position. The deionized water valve 83 is opened so that deionized water is supplied from the deionized water nozzle 81 to the substrate W. The deionized water supplied to the substrate W falls down to the outside of the substrate W. This deionized water is collected by the cup 62 and discharged via the drain pipe 69 to the drain 70. After the deionized water is supplied for a predetermined time, the deionized water valve 83 is closed and the deionized water nozzle 81 is returned to the standby position.

In this deionized water supply step, with the supplied deionized water, the substrate W is washed free from contaminants such as the removal liquid and reaction product.

Subsequently, the spin-dry step is performed. In this step, the substrate W is rotated at high speed so as to spin out the liquid existing on the substrate W. Thereby the substrate W is almost dried.

When the treatment in the removal processing unit SR is completed, the shutter 59 is opened and the first transport robot TR1 unloads the substrate W and places it on the second delivery table 71 of the interface IF. This substrate W is then taken out of the second delivery table 71 and loaded in one of the dry processing units DPH by the second transport robot TR2. In the dry processing unit DPH, the shutter 96 is opened and the second transport robot TR2 places the substrate W on the raised pins 88. The shutter 96 is then closed to maintain hermeticity of the sealed chamber 86.

Subsequently, the dry processing is performed by the dry processing unit DPH. This dry processing is executed by a sequence of dry process including temperature control step, substitution step, pressure reduction step, gas supply step, solvent supply step, and atmospheric pressure release step.

Firstly, the temperature controlled plate 87 is kept at a dry temperature before the substrate W is loaded in the sealed chamber 86. The term "dry temperature" means a temperature below the ignition point of an organic solvent. Hereat, the temperature controlled plate 87 is set at a temperature of 30° C. to 40° C., taking into consideration that IPA is used as the organic solvent. A reduction in throughput is avoidable because before loading the substrate W, the temperature of the temperature controlled plate 87 is controlled to maintain a predetermined temperature.

Subsequently, the pins 88 are lowered such that the substrate W is brought near the temperature controlled plate 87, and the temperature control step of heating the substrate W is executed. After closing the shutter 96, the pump 84 is driven to exhaust the atmosphere of the sealed chamber 86, whereas the gas valve 93 is opened to admit nitrogen gas into the sealed chamber 86. This effects the substitution step that the atmosphere of the sealed chamber 86 is substituted with a nitrogenous atmosphere.

Subsequently, during continued drive of the pump 84, the gas valve 93 is closed to stop the nitrogen gas supply to the sealed chamber 86, thereby reducing the pressure in the sealed chamber 86. This effects the pressure reduction step that the atmospheric pressure of the sealed chamber 86 is lowered than atmospheric pressure (101325 Pa). Hereat, the pressure in the sealed chamber 86 is reduced to 666.5 Pa to 6665 Pa, preferably 666.5 Pa to 2666 Pa.

In addition, after closing the gas valve 93, the solvent valve 94 is opened during continued drive of the pump 84. This effects the solvent supply step that the organic solvent is supplied from the solvent vapor nozzle 92 to the sealed chamber 86. After the solvent valve 94 is opened for a predetermined period of time, the solvent valve 94 is closed.

After closing the solvent valve 94, the gas valve 93 is opened again during continued drive of the pump 84. This effects the atmospheric pressure release step that the pressure in the sealed chamber 86 is returned to the atmospheric pressure. After an elapse of a predetermined time, the drive of the pump 84 is stopped in the state that the gas valve 93 is opened. The gas valve 93 is then closed and the dry processing is terminated.

Since the substrate W is heated in the temperature control step, the water remaining on the substrate W is easy to evaporate. In addition, the atmospheric pressure around the substrate W is lowered in the pressure reduction step. As the result, the boiling point of liquid is lowered thus to more facilitate evaporation of the deionized water remaining on the substrate W. That is, retaining the substrate W under reduced pressure atmosphere ensures a complete dry of the water.

Furthermore, the organic solvent vapor is supplied to the substrate W in the pressure reduction step. Thereby, the organic solvent is mixed with the water remaining on the substrate W. Since a mixture of the water and organic solvent has a lower boiling point than water, this mixture on the substrate W can evaporate easily thus to remove the water from the substrate W. In addition to this, because the substrate W is heated in the temperature control step and the atmospheric pressure around the substrate W is lowered in the pressure reduction step, the mixture of the water and organic solvent easily evaporates in a short period of time. This ensures an extremely complete dry of the substrate W.

In an alternative, the dry processing may be executed by the pressure reduction step and the atmospheric pressure release step. In this case, due to a reduction in the atmospheric pressure around the substrate W, the boiling point of the water remaining on the substrate W is lowered and the water evaporates easily, thereby effecting the dry processing.

In other alternative, the dry processing may be executed by the pressure reduction step, the solvent supply step, and the atmospheric pressure release step. Although a mixture of water on the substrate W and the organic solvent is formed in this case, this mixture evaporates easily because it has a lower boiling point than water. In addition to this, the boiling point is lowered due to a reduction in atmospheric pressure around the substrate W. This allows for a complete evaporation of the water in a still short period of time.

In other alternative, the dry processing may be executed by the pressure reduction step, the temperature control step, and the atmospheric pressure release step. In this case, the water on the substrate W is heated in the temperature control step and the surrounding atmospheric pressure is lowered, this water can completely evaporate in a short period of time.

In other alternative, the dry processing may be executed only by the solvent supply step. Although a mixture of water on the substrate W and the organic solvent is formed in this case, this mixture evaporates easily because it has a lower boiling point than water. Therefore, the substrate W can be dried completely in a short period of time.

In other alternative, the dry processing may be executed by the temperature control step and the solvent supply step. Although a mixture of water on the substrate W and the organic solvent is formed in this case, this mixture evaporates easily because it has a lower boiling point than water. In addition to this, since this mixture is heated in the temperature control step, the mixture easily reaches its boiling point and evaporates. Therefore, the substrate W can be dried completely in a short period of time.

On completion of the dry processing in the dry processing unit DPH, the entire substrate processing is completed, and the treated substrate W is then transported to the unloading part 33.

To effect this transportation, the pins 88 of the dry processing units DPH are firstly raised and the shutter 96 is opened. The second transport robot TR2 unloads the substrate W from the dry processing unit DPH and places it on the second delivery table 71 of the interface IF.

Subsequently, the first transport robot TR1 takes the substrate W on the second delivery table 71 and places it on the first delivery table 39 of the indexer part ID. By the transfer mechanism 37, the substrate W placed on the first delivery table 39 is taken out and loaded in the carrier C placed on the unloading part 33.

In an alternative, the first delivery table 39 of the indexer part ID and the second delivery table 71 of the interface IF may be constructed by a plurality of substrate mounting parts such as a multistage table. In this case, a treated substrate W and untreated substrate W can coexist in the interface IF, thereby avoiding a drop in throughput.

Although in the foregoing embodiment, the indexer part ID is divided into the loading part 31 and unloading part 33, the indexer part ID may not be divided. In this case, a substrate W after being unloaded in a carrier C and passing through the processing is loaded in the same carrier C.

The substrate processing apparatus 1 can execute particularly superior processing when a porous thin film is present on a substrate W. The porous thin film has such a structure that there are a large number of fine holes through which deionized water enters. Therefore the deionized water relatively tends to remain the porous thin film. For example, if this thin film is an insulating film, there is the problem that the remaining deionized water may increase dielectric constant and deteriorate insulating properties. However, this problem can be solved by the substrate processing apparatus 1 capable of completely removing deionized water.

1-6. Apparatus Layout

Figure 5:
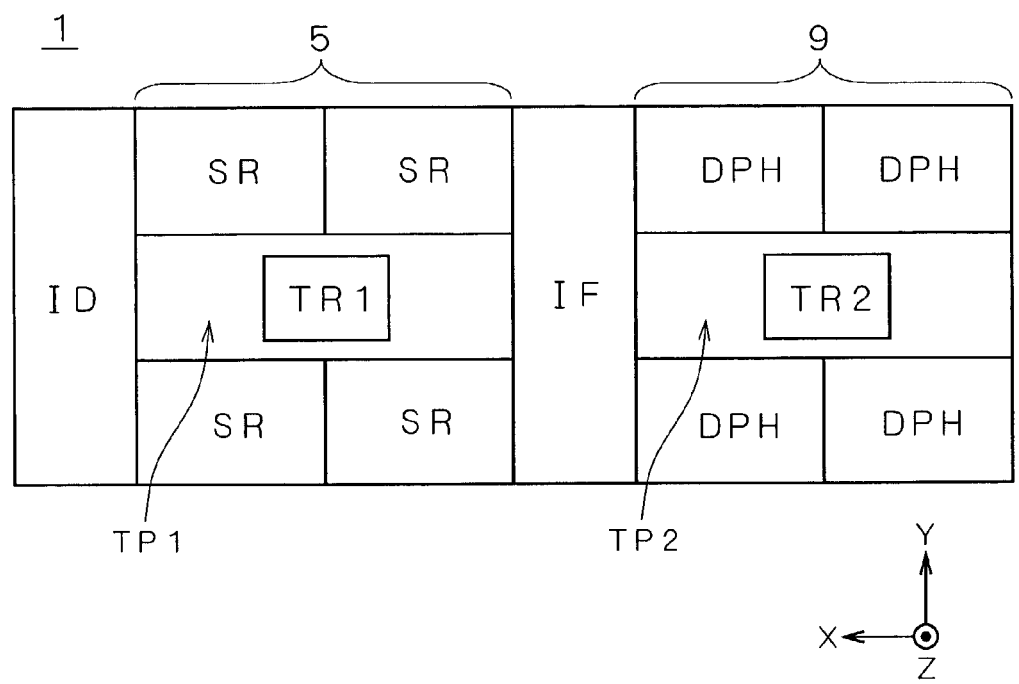
FIGS. 5 and 6 are diagrams showing the layout of the substrate processing apparatus of the first preferred embodiment.
Figure 6:
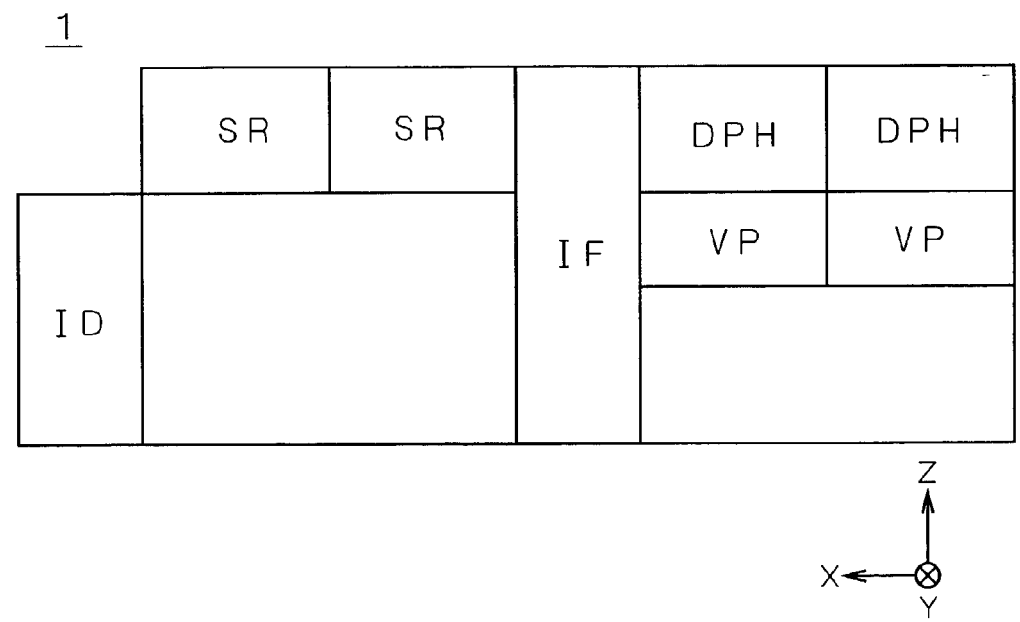

The construction and operation of the substrate processing apparatus 1 have been described above. Following is a layout of the substrate processing apparatus 1. FIGS. 5 and 6 are diagrams showing the layout of the substrate processing apparatus according to the first preferred embodiment. FIG. 5 shows a top view of the layout, and FIG. 6 shows a side view of the layout. FIG. 5 and the following drawings are accompanied with an XYZ orthogonal coordinate system wherein the Z-axis is a vertical direction and the XY plane is a horizontal plane, in order to clarify their respective directional relationships as needed.

Referring to FIG. 5, the layout of the substrate processing apparatus 1 can be roughed out that the indexer part ID, removal processing part 5, interface IF, and dry processing part 9 are disposed adjacent to each other in a row in the X direction. Specifically, the removal processing part 5 that performs processing for removing an organic matter by a removal liquid is disposed adjacent to the indexer part ID that loads and unloads a substrate W with respect to the exterior of the apparatus. Between the removal processing part 5 and the dry processing part 9 that performs dry processing of a substrate after passing through the removal processing, the interface IF is disposed to give and receive a substrate W between the removal processing part 5 and the dry processing part 9.

The layout of the substrate processing apparatus 1 of the first preferred embodiment will be described in more detail. When viewed from above, the first transport path TP1 of the removal processing part 5 is of a lengthy or rectangular shape taking the X direction as its longitudinal direction, and one end of the first transport path TP1 is in contact with the indexer part ID and the other end is in contact with the interface IF. Two removal processing units SR are disposed on both sides of the first transport path TP1. That is, the first transport path TP1 is surrounded by the four removal processing units SR. The first transport robot TR1 is disposed on the first transport path TP1 and transports a substrate W among the indexer part ID, interface IF, and four removal processing units SR.

Likewise, when viewed from above, the second transport path TP2 of the dry processing part 9 is of a lengthy or rectangular shape taking the X direction as its longitudinal direction, and its one end is in contact with the interface IF. Two dry processing units DPH are disposed on both sides of the second transport path TP2. That is, the second transport path TP2 is surrounded by the four dry processing units DPH. The second transport robot TR2 is disposed on the second transport path TP2 and performs transportation of a substrate W among the interface IF and four dry processing units DPH.

Referring to FIG. 6, when the substrate processing apparatus 1 is viewed from a side, the solvent vapor generating units VP are disposed below the four dry processing units DPH, respectively. An organic solvent vapor (IPA vapor is used hereat) is supplied from the solvent vapor generating units VP to the overlying dry processing units DPH, respectively.

By employing the above-mentioned layout, the dry processing units DPH in addition to the removal processing units SR can efficiently be incorporated into a single substrate processing apparatus 1, so that the substrate after passing through the reaction product removal processing can be dried completely. Furthermore, by disposing the solvent vapor generating units VP below the four dry processing units DPH, the hot organic solvent vapor naturally travels upward thus to increase the efficiency of supply of the organic solvent vapor.

2. Second Preferred Embodiment

Figure 7:
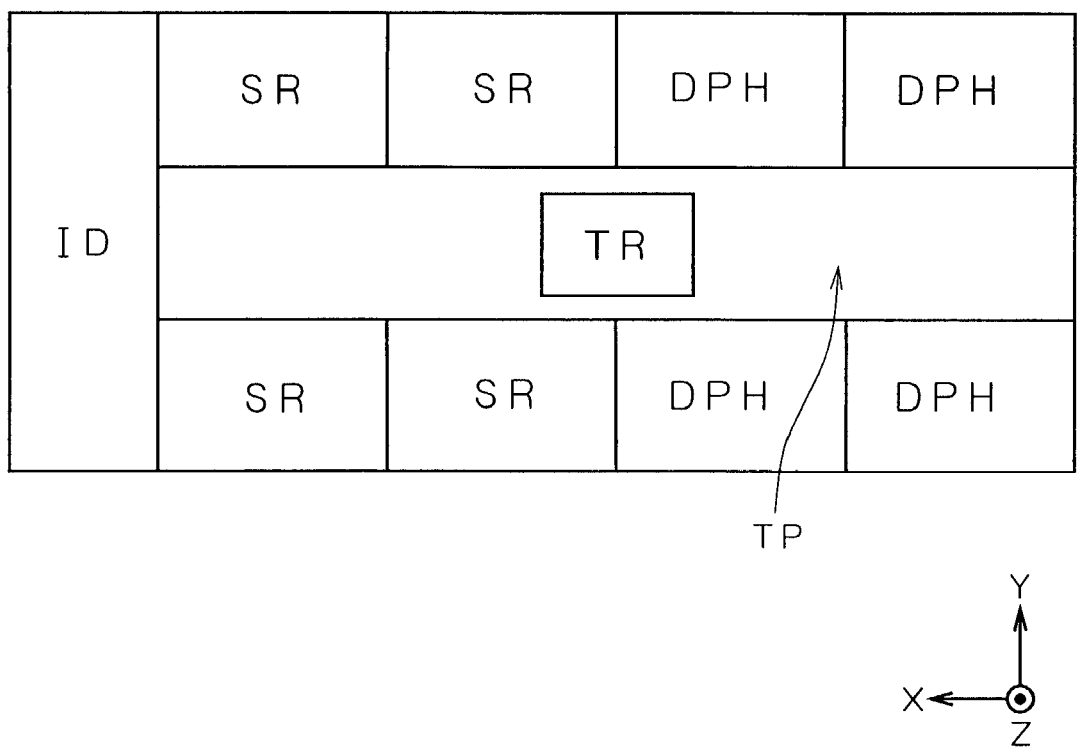
FIG. 7 is a diagram showing the layout of a substrate processing apparatus according to a second preferred embodiment.

A second preferred embodiment of the present invention will be described below. FIG. 7 is a diagram showing a layout of a substrate processing apparatus of the second preferred embodiment. This substrate processing apparatus 2 is different from the substrate processing apparatus 1 of the first preferred embodiment in the point that the removal processing part 5 is directly connected to the dry processing part 9, without disposing the interface IF. Therefore, as shown in FIG. 7, a single transport robot TR is disposed on a single transport path TP in the substrate processing apparatus 2.

When the substrate processing apparatus 2 is viewed from above, the transport path TP is of a lengthy or rectangular shape taking the X direction as its longitudinal direction, and one end of the transport path TP is in contact with an indexer part ID. Two removal processing units SR and two dry processing units DPH are disposed on both sides of the transport path TP. That is, the transport path TP is surrounded by the four removal processing units SR and also surrounded by the four dry processing units DPH. The transport robot TR is disposed on the transport path TP and transports a substrate W among the indexer part ID, four removal processing units SR, and four dry processing units DPH. As in the first preferred embodiment, solvent vapor generating units for supplying an organic solvent vapor to the dry processing units DPH (which are the same as in the first preferred embodiment and therefore not shown) are disposed below the four dry processing units DPH, respectively.

The construction and operation of the removal processing units SR and dry processing units DPH of the second preferred embodiment are the same as that of the first preferred embodiment, and a substrate processing method using the substrate processing apparatus 2 is also the same as that of the first preferred embodiment. Therefore, their descriptions are omitted here. The construction of the transport robot TR is the same as that of the first and second transport robots TR1 and TR2 in the first preferred embodiment. The transport robot TR transports an untreated substrate W from the indexer part ID to one of the removal processing units SR, and transports a substrate W after passing through the removal processing from the removal processing unit SR to one of the dry processing units DPH, and also transports a substrate W after passing through the dry processing from the dry processing unit DPH to the indexer part ID.

With this construction, in addition to the removal processing units SR, the dry processing units DPH can be efficiently incorporated into a single substrate processing apparatus 2, so that the substrate is completely dried after the reaction product removal processing, as in the first preferred embodiment. Furthermore, the absence of the interface IF reduces the footprint (the plan area occupied by the apparatus) of the substrate processing apparatus 2 by the area of the interface IF.

3. Third Preferred Embodiment

Figure 8:
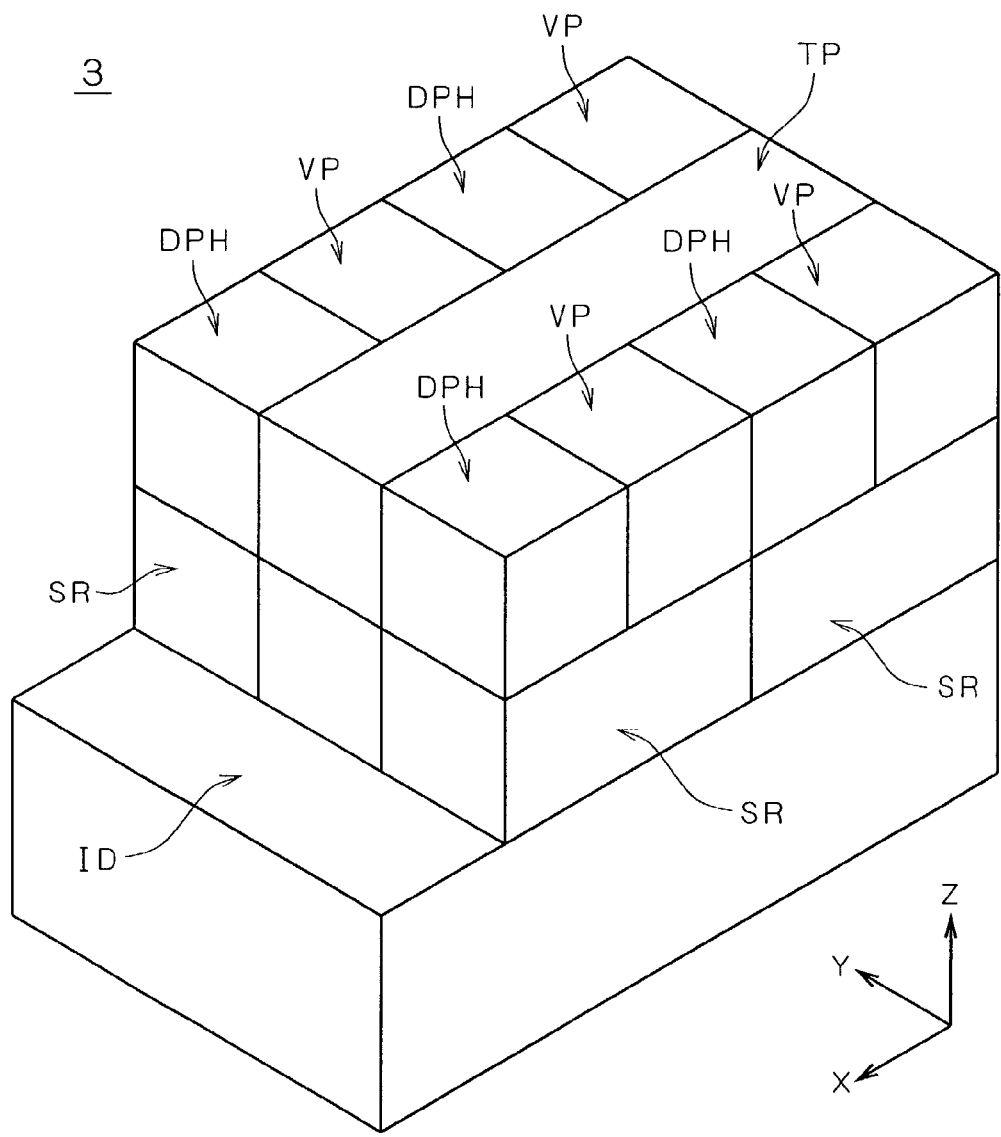

A third preferred embodiment of the present invention will be described below. FIGS. 8 and 9 are diagrams showing a layout of a substrate processing apparatus 3 of the third preferred embodiment. FIG. 8 is a perspective view and FIG. 9 is a side view of this apparatus. The substrate processing apparatus 3 is different from the substrate processing apparatus 1 of the first preferred embodiment in the point that a removal processing part 5 and dry processing part 9 are stacked in a height direction (Z direction), without disposing any interface IF.

When the substrate processing apparatus 3 is viewed from above, a transport path TP is of a lengthy or rectangular shape taking the X direction as its longitudinal direction, and one end of a transport path TP is in contact with an indexer part ID. Two removal processing units SR and two dry processing units DPH are disposed on both sides of the transport path TP. That is, the transport path TP is surrounded by the four removal processing units SR and also surrounded by the four dry processing units DPH. A transport robot (not shown) which is the same as the transport robot TR of the second preferred embodiment is disposed on the transport path TP and transports a substrate W among the indexer part ID, four removal processing units SR, and four dry processing units DPH.

Unlike the second preferred embodiment, the removal processing units SR are disposed below the four dry processing units DPH, respectively, in the third preferred embodiment. Solvent vapor generating units for supplying an organic solvent vapor to the dry processing units DPH are respectively disposed laterally with respect to the dry processing units DPH and upwardly with respect to the removal processing units SR.

The construction and operation of the removal processing units SR and dry processing units DPH of the third preferred embodiment are the same as that of the first preferred embodiment, and a substrate processing method using the substrate processing apparatus 3 is also the same as that of the first preferred embodiment. Therefore, their descriptions are omitted here. The construction of the transport robot disposed on the transport path TP is the same as that of the first and second transport robots TR1 and TR2 in the first preferred embodiment. The transport robot transports an untreated substrate W from the indexer part ID to one of the removal processing units SR, and transports a substrate W after passing through the removal processing from the removal processing unit SR to one of the dry processing units DPH, and also transports a substrate W after passing through the dry processing from the dry processing unit DPH to the indexer part ID.

With this construction, in addition to the removal processing units SR, the dry processing units DPH can be efficiently incorporated into a single substrate processing apparatus 3, so that the substrate is completely dried after the reaction product removal processing, as in the first preferred embodiment. Furthermore, the footprint of the substrate processing apparatus 3 can be further reduced than the first preferred embodiment by disposing the removal processing units SR below the dry processing units DPH, respectively, more specifically, by stacking the dry processing unit DPH and removal processing unit SR in the height direction.

4. Fourth Preferred Embodiment

Figure 10:
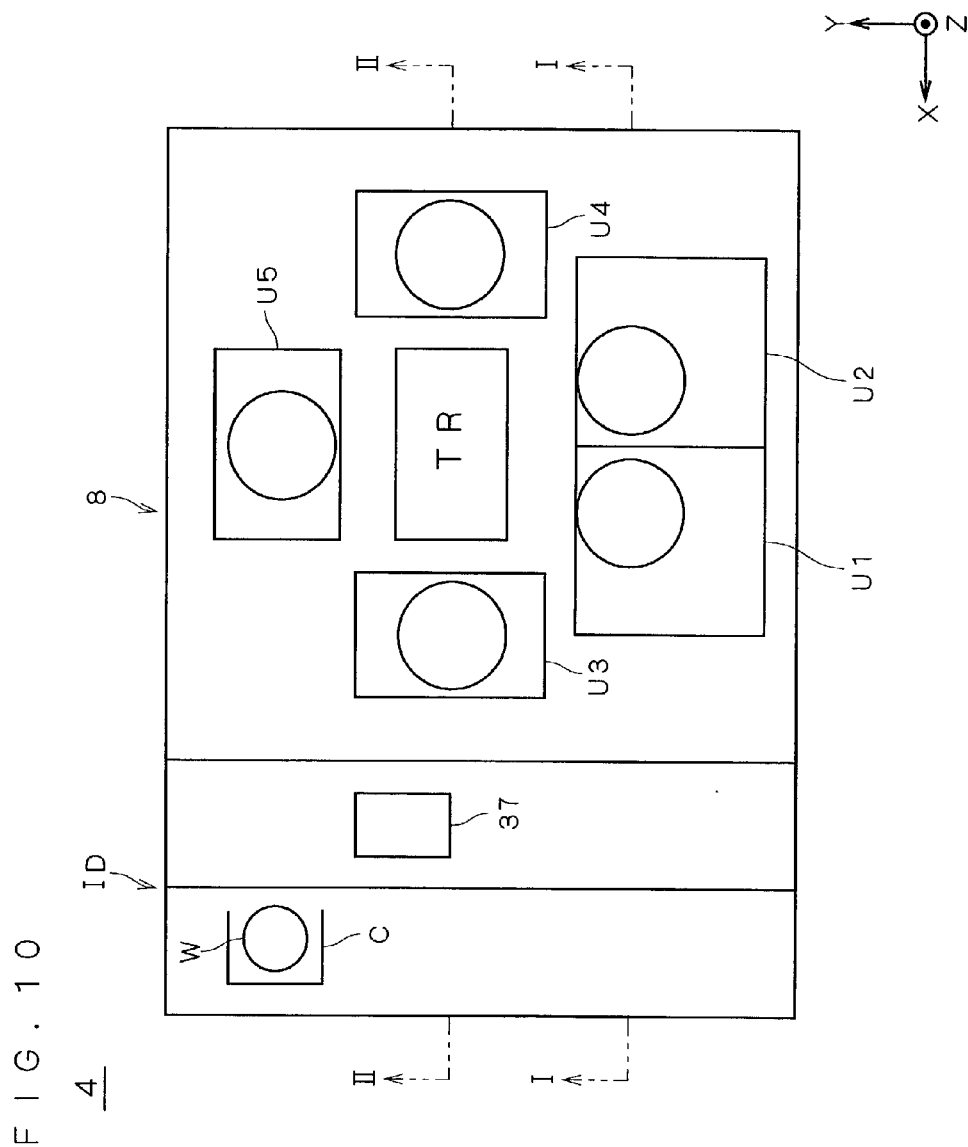
FIG. 10 is a plan view showing the layout of a substrate processing apparatus according to a fourth preferred embodiment.
Figure 11:
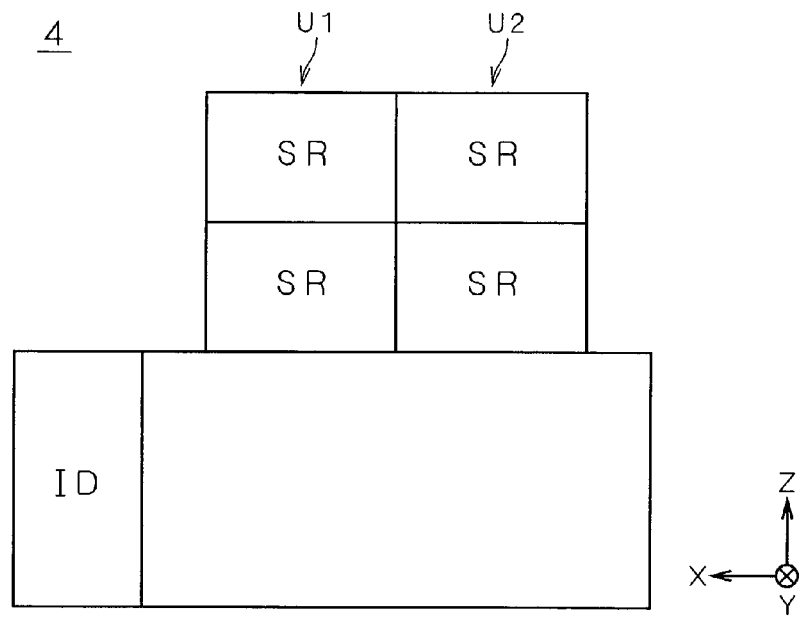
FIG. 11 is a sectional view of the substrate processing apparatus taken along the line I—I in FIG. 10.
Figure 12:
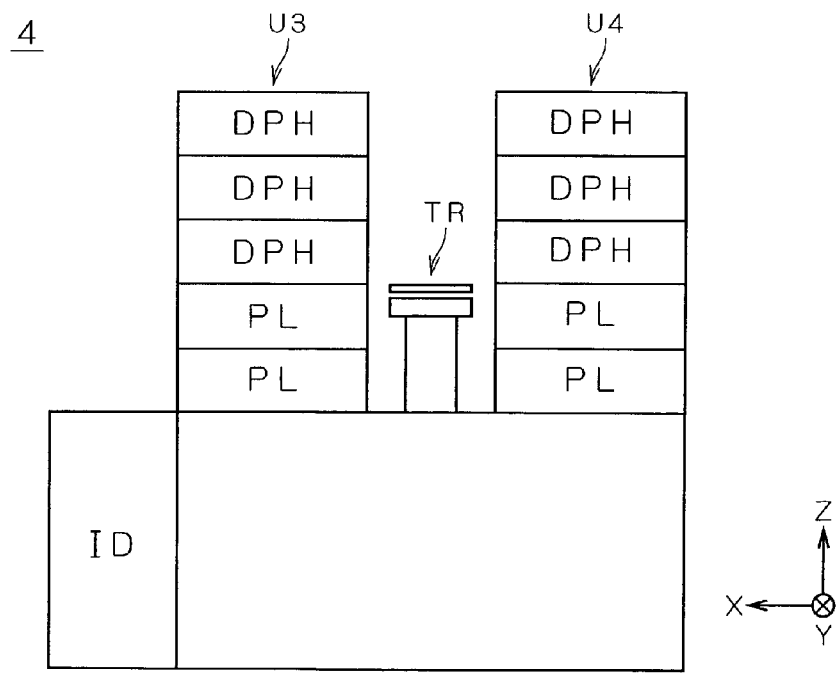
FIG. 12 is a sectional view of the substrate processing apparatus taken along the line II—II in FIG. 10.

Following is a fourth preferred embodiment of the present invention. FIG. 10 is a plan view of a layout of a substrate processing apparatus 4 of the fourth preferred embodiment. FIG. 11 is a sectional view when the apparatus 4 is viewed from the line I—I in FIG. 10. FIG. 12 is a sectional view when the apparatus 4 is viewed from the line II—II in FIG. 10.

The substrate processing apparatus 4 of the fourth preferred embodiment comprises an indexer part ID and a processing station 8. The construction and function of the indexer part ID is the same as that of the first preferred embodiment, except for the absence of the first delivery table 39. The processing station 8 has removal processing parts U1 and U2, dry processing parts U3 and U4, a general-purpose part U5, and a transport robot TR.

The removal processing parts U1 and U2 are respectively formed by stacking two removal processing units SR in a height direction (Z direction). Specifically, in the removal processing parts U1 and U2, the removal processing units SR are disposed in upper and lower stages. The construction and function of the removal processing units SR are the same as that of the first preferred embodiment, and an organic matter attached to a substrate W can be removed by supplying a removal liquid to the substrate W while rotating the substrate W.

The dry processing units U3 and U4 are respectively formed by three dry processing units DPH and two delivery plates PL, which are stacked in a height direction (Z direction) by disposing the three dry processing units DPH on top of the two stacked delivery plates PL. That is, in the dry processing units U3 and U4, the dry processing units DPH are disposed in three stages. The construction and function of the dry processing units DPH are the same as that of the first preferred embodiment, and the substrate W can be dried under reduced pressure. The delivery plates PL have the same construction and function as that of the first delivery table 39 and second delivery table 71 in the first preferred embodiment. Specifically, a substrate W is given and received via the delivery plates PL between the transport robot TR of the processing station 8 and the transfer mechanism 37 of the indexer ID.

As required, a variety of processing units can be stacked and incorporated into a general-purpose processing part U5. Examples of processing units incorporated into the general-purpose processing part U5 are the above-mentioned removal processing unit SR and dry processing unit DPH, and other heat treating unit.

The transport robot TR has the same construction as the first transport robot TR1 of the first preferred embodiment, except for the absence of the horizontal drive mechanism. Specifically, in the fourth preferred embodiment, the transport robot TR has no horizontal drive mechanism made up of the mail screw 27 and guide rails 26 etc., as shown in FIG. 4, namely, it is a so-called stationary transport robot. Therefore, the transport robot TR of the fourth preferred embodiment can direct a transport arm to perform a lifting action in the height direction, rotational action, as well as advance and retreat action in a horizontal direction.

Referring to FIG. 10, the transport robot TR is disposed at the center of the processing station 8, and the removal processing parts U1 and U2, dry processing parts U3 and U4, and general-purpose processing part U5 are disposed around the transport robot TR. Specifically, the removal processing parts U1 and U2 are disposed adjacent to each other at the front of the processing station 8 (i.e., (−Y) side). The dry processing part U3 is disposed adjacent to the indexer part ID, and the dry processing part U4 is disposed on the opposite side of the dry processing part U3 with the transport robot TR interposed therebetween. The general-purpose processing part U5 is disposed at the back of the processing station 8 (i.e., (+Y) side). Therefore, without having the horizontal drive mechanism, the transport robot TR can access to all the removal processing parts U1 and U2, the dry processing parts U3 and U4, and the general-purpose processing part U5, thereby transporting a substrate W among the removal processing units SR, dry processing units DPH, and delivery plates PL.

Since a substrate processing method using the substrate processing apparatus 4 is the same as that of the first preferred embodiment, its description is omitted here. The transport robot TR transports, via the delivery plates PL, an untreated substrate W from the indexer part ID to one of the removal processing units SR, and transports a substrate W after passing through the removal processing from the removal processing unit SR to one of the dry processing units DPH, and also transports, via the delivery plate PL, a substrate W after passing through the dry processing from the dry processing unit DPH to the indexer part ID.

With this construction, in addition to the removal processing units SR, the dry processing units DPH can efficiently be incorporated into a single substrate processing apparatus 4, so that the substrate is completely dried after the reaction product removal processing, as in the first preferred embodiment.

5. Fifth Preferred Embodiment

Figure 13:
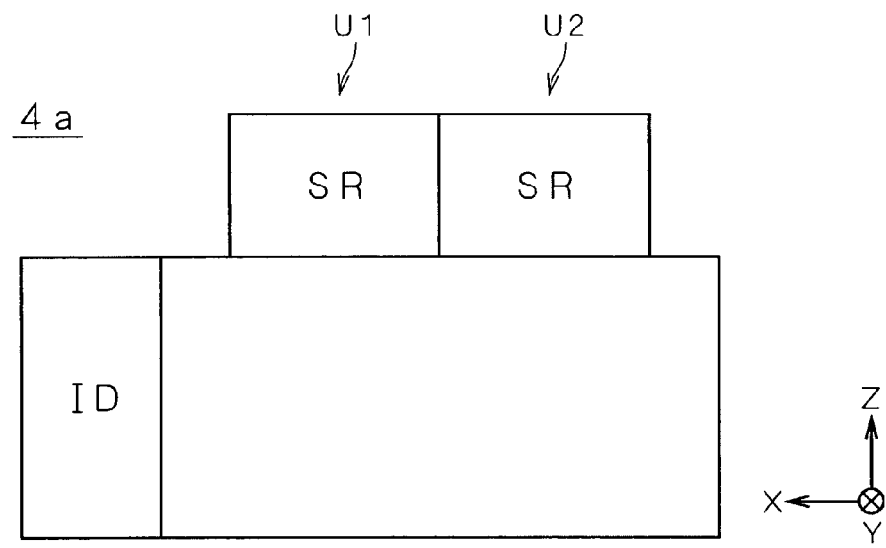
FIGS. 13 and 14 are sectional views of a substrate processing apparatus according to a fifth preferred embodiment.
Figure 14:
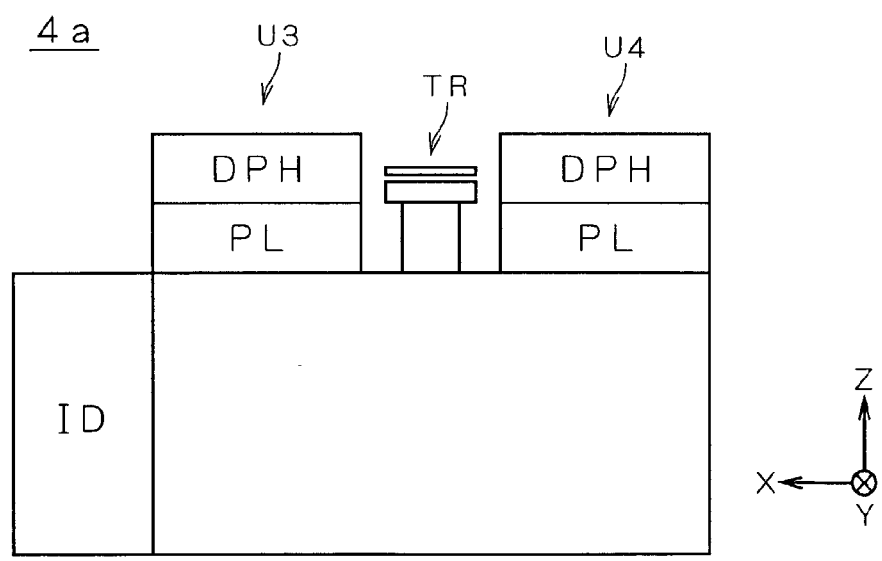

Following is a fifth preferred embodiment of the present invention. The layout of a substrate processing apparatus 4a of the fifth preferred embodiment is the same as that shown in FIG. 10. FIG. 13 is a sectional view when the substrate processing apparatus 4a is viewed from the line I—I in FIG. 10. FIG. 14 is a sectional view when the substrate processing apparatus 4a is viewed from the line II—II in FIG. 10.

The construction of the substrate processing apparatus 4a of the fifth preferred embodiment is the same as that of the substrate processing apparatus 4 of the fourth preferred embodiment, except for the number of stages of the removal processing parts U1 and U2, and dry processing parts U3 and U4. Therefore its detailed description is omitted here. That is, as shown in FIG. 13, both of removal processing parts U1 and U2 are formed by disposing a single removal processing unit SR in a single stage.

Referring to FIG. 14, the dry processing parts U3 and U4 are respectively formed by a single dry processing unit DPH and a single delivery plate PL, which are stacked in a height direction (Z direction) by disposing the dry processing unit DPH on the delivery plate PL. That is, a single dry processing unit DPH is disposed at a single stage in both of the dry processing parts U3 and U4. The construction and function of the removal processing unit SR and dry processing unit DPH are the same as that in the first preferred embodiment. The delivery plate PL is the same as that of the fourth preferred embodiment.

Also in the fifth preferred embodiment, the transport robot TR is disposed at the center of the processing station 8 and the removal processing parts U1 and U2, dry processing parts U3 and U4, and a general-purpose processing part U5 are disposed around the transport robot TR, as shown in FIG. 10. Specifically, the removal processing parts U1 and U2 are disposed adjacent to each other at the front of the processing station 8 (i.e., (−Y) side). The dry processing part U3 is disposed adjacent to the indexer part ID, and the dry processing part U4 is disposed on the opposite side of the dry processing part U3 with the transport robot TR interposed therebetween. The general-purpose processing part U5 is disposed at the back of the processing station 8 (i.e., (+Y) side). Therefore, without having the horizontal drive mechanism, the transport robot TR can access to all the removal processing parts U1 and U2, the dry processing parts U3 and U4, and the general-purpose processing part U5, thereby transporting a substrate W among the removal processing units SR, dry processing units DPH, and delivery plate PL.

Since a substrate processing method using the substrate processing apparatus 4a is the same as that of the first preferred embodiment, its description is omitted here. The transport robot TR transports, via the delivery plate PL, an untreated substrate W from the indexer part ID to one of the removal processing units SR, and transports a substrate W after passing through the removal processing from the removal processing unit SR to one of the dry processing units DPH, and also transports, via the delivery plate PL, a substrate W after passing through the dry processing from the dry processing unit DPH to the indexer part ID.

With this construction, in addition to the removal processing units SR, the dry processing units DPH can be efficiently incorporated into a single substrate processing apparatus 4a, so that the substrate is completely dried after the reaction product removal processing, as in the first preferred embodiment.

6. Sixth Preferred Embodiment

Figure 15:
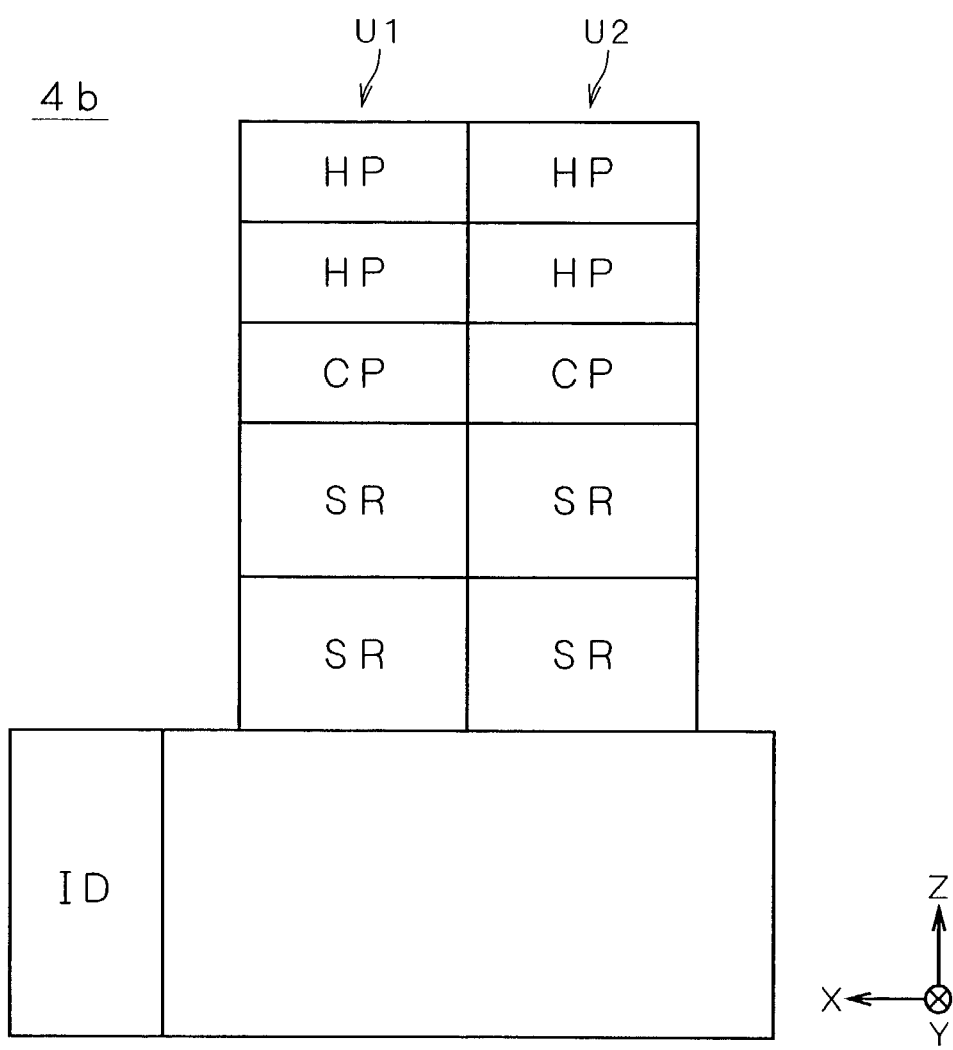
FIGS. 15 and 16 are sectional views of a substrate processing apparatus according to a sixth preferred embodiment.
Figure 16:
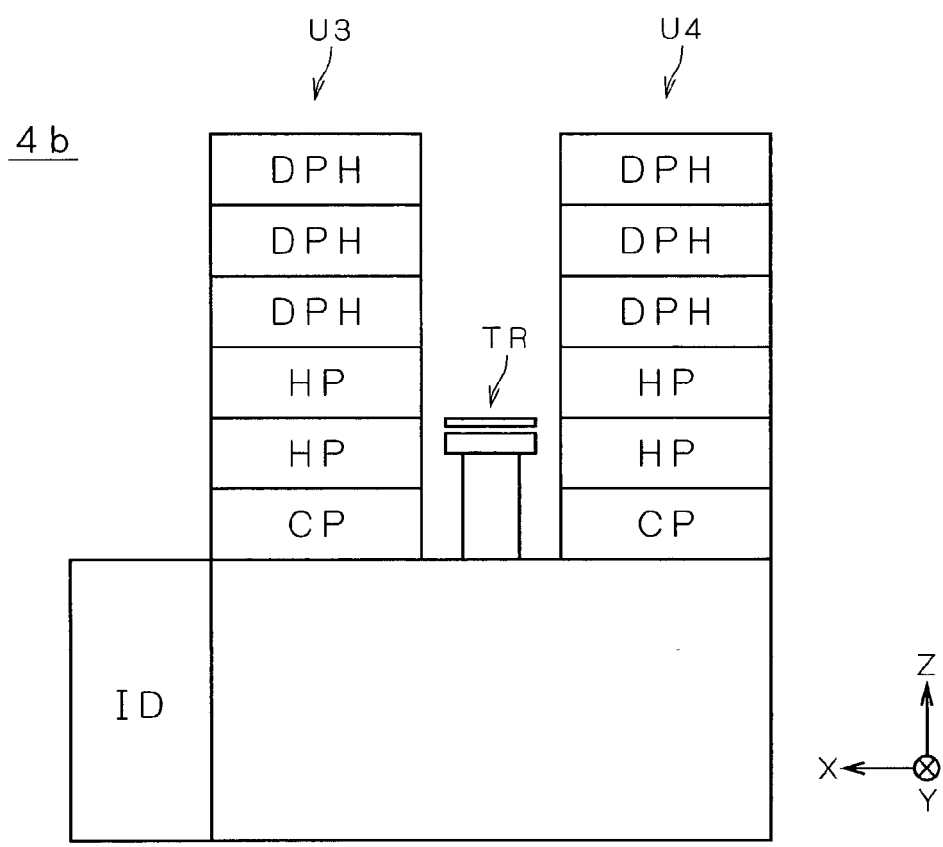

Following is a sixth preferred embodiment of the present invention. The layout of a substrate processing apparatus 4b of the sixth preferred embodiment is the same as that shown in FIG. 10. FIG. 15 is a sectional view when the substrate processing apparatus 4b is viewed from the line I—I in FIG. 10. FIG. 16 is a sectional view when the substrate processing apparatus 4b is viewed from the line II—II in FIG. 10.

The construction of the substrate processing apparatus 4b of the sixth preferred embodiment is the same as that of the substrate processing apparatus 4 of the fourth preferred embodiment, except for the construction of the removal processing parts U1 and U2, and dry processing parts U3 and U4. Therefore its detail description is omitted here.

Referring to FIG. 15, the removal processing parts U1 and U2 of the sixth preferred embodiment are respectively formed by two heating units HP, one cooling unit CP, two removal processing units SR, which are stacked in a height direction (Z direction) by disposing the cooling unit CP on top of the stacked two removal processing units SR, and the two heating units HP on top of the cooling unit CP. That is, the removal processing parts U1 and U2 are respectively formed by disposing these processing units in a multistage. These multistage processing units contain both of the removal processing units SR and heat treating units (the heating unit HP and cooling unit CP). The heating unit HP is one that heats a substrate W to a predetermined temperature, namely, a hot plate. The cooling unit CP is one that cools a substrate W to a predetermined temperature and maintains the substrate W at that temperature, namely, a cool plate. The construction and function of the removal processing unit SR is the same as that of the first preferred embodiment.

Referring to FIG. 16, dry processing parts U3 and U4 of the sixth preferred embodiment are respectively formed by three dry processing units DPH, two heating units HP, and one cooling unit CP, which are stacked in a height direction (Z direction) by disposing the stacked two heating units HP on top of the cooling unit CP, and the stacked three dry processing units DPH on top of the stacked two heating units HP. That is, the dry processing parts U3 and U4 are respectively formed by stacking these processing units in a multistage. These multistage processing units includes both of the dry processing units DPH and heat treating units (the heating unit HP and cooling unit CP). The heating unit HP and cooling unit CP are the same as that described above.

The construction and function of the dry processing units DPH are the same as that of the first preferred embodiment.

Also in the sixth preferred embodiment, the transport robot TR is disposed at the center of the processing station 8, and the removal processing parts U1 and U2, dry processing parts U3 and U4, and a general-purpose processing part U5 are disposed around the transport robot TR, as shown in FIG. 10. Specifically, the removal processing parts U1 and U2 are disposed adjacent to each other at the front of the processing station 8 (i.e., (−Y) side). The dry processing part U3 is disposed adjacent to the indexer part ID, and the dry processing part U4 is disposed on the opposite side of the dry processing part U3 with the transport robot TR interposed therebetween. The general-purpose processing part U5 is disposed at the back of the processing station 8 (i.e., (+Y) side). Therefore, without having the horizontal drive mechanism, the transport robot TR can access to all the removal processing parts U1 and U2, the dry processing parts U3 and U4, and the general-purpose processing part U5, thereby transporting a substrate W among the removal processing units SR, dry processing units DPH, and heating units HP, and cooling unit CP.

Since a substrate processing method using the substrate processing apparatus 4b is the same as that of the first preferred embodiment, its description is omitted here. The transport robot TR transports, via the cooling unit CP, an untreated substrate W from the indexer part ID to one of the removal processing units SR, and transports a substrate W after passing through the removal processing from the removal processing unit SR to one of the dry processing units DPH, and also transports, via the cooling unit CP, a substrate W after passing through the dry processing from the dry processing unit DPH to the indexer part ID. Furthermore in the substrate processing apparatus 4b of the sixth preferred embodiment, as required, the heating unit HP and cooling unit CP can be used to perform heat treatment of a substrate W.

With this construction, in addition to the removal processing units SR, the dry processing units DPH can be efficiently incorporated into a single substrate processing apparatus 4b, so that the substrate is completely dried after the reaction product removal processing, as in the first preferred embodiment.

7. Modifications

Although the preferred embodiments of the present invention have been described above, this invention is not to be limited to the foregoing preferred embodiments. For example, every foregoing preferred embodiment discloses to remove, from the substrate after passing through the dry etching step in which the thin film present on the substrate surface is subjected to dry etching using a resist film as a mask, polymer that is the reaction product formed during the dry etching. However, the present invention is not to be limited to the case of removing the polymer present on a substrate that has been formed during dry etching.

For example, the present invention is applicable to the case that polymer formed during a plasma ashing is removed from a substrate. The present invention is therefore applicable to the case that polymer formed by a resist in a variety of processing, besides the dry etching, is removed from a substrate.

The present invention is not to be limited to the case of removing polymer that is formed by dry etching and plasma ashing processing, but is applicable to the case that a variety of reaction products derived from a resist are removed from a substrate.

Further, the present invention is not to be limited to the case of removing a reaction product derived from a resist, but is applicable to the case of removing the resist itself.

For example, the present invention is applicable to the case of having its processing object a substrate that has been subjected to the following steps of: applying a resist; exposing a wiring pattern etc. on the resist; developing the resist; and performing underlayer processing to a layer underlying the resist (e.g., etching to a thin film as an underlayer), and removing the resist film that becomes unnecessary after the underlayer processing.

In this case, if there is a reaction product formed by deterioration of the resist film, this reaction product can be removed at the same time that the unnecessary resist film is removed, thereby increasing throughput and reducing the cost. For example, in the above-mentioned underlayer processing, when the thin film as the underlayer is subjected to a dry etching, a reaction product is also formed. Accordingly, (i) the resist film itself that is used for masking the underlayer during the dry etching; and (ii) the reaction product formed by deterioration of the resist film can be removed concurrently.

Besides the case that the reaction product derived from a resist and the resist itself is removed from the substrate, the present invention is also applicable to the case that an organic matter not derived from the resist (e.g., fine contaminant derived from the human body) is removed from a substrate by a removal liquid for the organic matter.

Although in the first to third preferred embodiments the transport robot is of traveling type having the horizontal drive mechanism, the transport robot may be of stationary type having no horizontal drive mechanism, as in the fourth preferred embodiment.

Although in the first to sixth preferred embodiments the transport robot employs a single transport arm, i.e., a single arm, it may employ two transport arms, namely a double arm. When there is many transport destinations, the double arm can further increase throughput.

Although in the first to sixth preferred embodiments the transport robot has the telescopic lifting mechanism for lifting and lowering the transport arm, instead of being restricted to this, the transport arm may be lifted and lowered by other lifting mechanism such as a combination of ball screw and linear guide. It is however preferred to employ the telescopic lifting mechanism that performs a lifting action by the telescopic motion of the telescopic motion body 20, because it is possible to suppress the apparatus size from increasing even when the processing units are stacked in a multistage thus to increase the apparatus height.

Although in the fourth preferred embodiment the removal processing units SR are disposed in two stages and the dry processing units DPH are disposed in three stages, the number of units is of course not limited to two or three.

In the fifth preferred embodiment one stage of the removal processing unit SR and one stage of the dry processing unit DPH are incorporated into both of the removal processing parts U1 and U2, and into both of the dry processing parts U3 and U4. In an alternative, one stage of the removal processing unit SR or dry processing unit DPH may be incorporated into either one of the removal processing part or dry processing part, and a multistage removal processing unit SR or dry processing unit DPH may be incorporated into the other.

Although in the sixth preferred embodiment the heat treating unit is incorporated into both of the removal processing parts U1 and U2, and into both of the dry processing parts U3 and U4, the heat treating unit may be incorporated into only either of the removal processing parts and dry processing parts.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus that removes a reaction product formed by deterioration of a resist and/or thin film attached to a substrate by a removal liquid for said reaction product, said apparatus comprising:
   an indexer part that mounts a cassette encasing a substrate and that loads and unloads a substrate with respect to the exterior of said apparatus;
   a removal processing part for performing a removal processing comprising removing said reaction product, said removal processing part being disposed adjacent to said indexer part and including a holding part for holding a single substrate in a substantially horizontal position while rotating said single substrate and a removal liquid supply part for supplying said removal liquid to a surface of said single substrate held by said holding part;
   a dry processing part for performing a dry processing of a substrate which has been subjected to said removal processing, said dry processing part including a temperature controlled plate for receiving said substrate thereon for heating, a sealed chamber that is airtight for housing said temperature controlled plate and a pressure reduction part for reducing the pressure within said sealed chamber; and
   an interface that is disposed so as to be sandwiched between said removal processing part and said dry processing part, and that gives and receives a substrate between said removal processing part and said dry processing part.

2. The substrate processing apparatus according to claim 1 wherein
   said reaction product is polymer formed by one of ashing and dry etching, and
   said removal liquid is a polymer removal liquid.

3. A substrate processing apparatus that removes a reaction product formed by deterioration of a resist and/or thin film attached to a substrate by a removal liquid for said reaction product, said apparatus comprising:
   an indexer part that mounts a cassette encasing a substrate and that loads and unloads a substrate with respect to the exterior of said apparatus;
   a removal processing part for performing a removal processing comprising removing said reaction product, said removal processing part being disposed adjacent to said indexer part;
   a dry processing part for performing a dry processing of a substrate which has been subjected to said removal processing; and
   an interface that is disposed so as to be sandwiched between said removal processing part and said dry processing part, and that gives and receives a substrate between said removal processing part and said dry processing part, wherein
   said removal processing part comprises:
   a first transport path, one end of which is in contact with said indexer part and the other end is in contact with said interface;
   a plurality of removal processing units surrounding said first transport path, each of said plurality of removal processing units including a holding part for holding a single substrate in a substantially horizontal position while rotating said single substrate and a removal liquid supply part for supplying said removal liquid to a surface of said single substrate held by said holding part; and
   a first transport robot being disposed on said first transport path and transporting a substrate among said indexer part, said interface, and said plurality of removal processing units, and
   said dry processing part comprises:
   a second transport path, one end of which is in contact with said interface;
   a plurality of dry processing units surrounding said second transport path and drying a substrate, each of said plurality of dry processing units including a temperature controlled plate for receiving said substrate thereon for heating, a sealed chamber that is airtight for housing said temperature controlled plate and a pressure reduction part for reducing the pressure within said sealed chamber; and
   a second transport robot being disposed on said second transport path and transporting a substrate among said interface and said plurality of dry processing units.

4. The substrate processing apparatus according to claim 3 wherein
   said dry processing part further comprises organic solvent vapor generating units that are disposed below said plurality of dry processing units, respectively, and supply an organic solvent vapor to said plurality of dry processing units.

5. The substrate processing apparatus according to claim 4 wherein
   said first transport robot and said second transport robot have a telescopic lifting mechanism performing a lifting action by telescopic motion of a telescopic motion body.

6. The substrate processing apparatus according to claim 5 wherein
   said reaction product is polymer formed by one of ashing and dry etching, and
   said removal liquid is a polymer removal liquid.

7. A substrate processing apparatus that removes a reaction product formed by deterioration of a resist and/or a thin film attached to a substrate by a removal liquid for said reaction product, said apparatus comprising:
   an indexer part that mounts a cassette encasing a substrate and that loads and unloads a substrate with respect to the exterior of said apparatus;
   a transport path, one end of which is in contact with said indexer part;
   a plurality of removal processing units surrounding said transport path and performing a removal processing comprising removing said reaction product, each of said plurality of removal processing units including a holding part for holding a single substrate in a substantially horizontal position while rotating said single substrate and a removal liquid supply part for supplying said removal liquid to a surface of said single substrate held by said holding part;
   a plurality of dry processing units surrounding said transport path and drying a substrate, each of said plurality of dry processing units including a temperature controlled plate for receiving said substrate thereon for heating, a sealed chamber that is airtight for housing said temperature controlled plate and a pressure reduction part for reducing the pressure within said sealed chamber; and a transport robot being disposed on said transport path and transporting a substrate among said indexer part, said plurality of removal processing units, and said plurality of dry processing units.

8. The substrate processing apparatus according to claim 7 further comprising:

organic solvent vapor generating units that are disposed below said plurality of dry processing units, respectively, and supply an organic solvent vapor to said plurality of dry processing units.

9. The substrate processing apparatus according to claim 8 wherein said transport robot has a telescopic lifting mechanism performing a lifting action by telescopic motion of a telescopic motion body.

10. The substrate processing apparatus according to claim 9 wherein said reaction product is polymer formed by one of ashing and dry etching, and said removal liquid is a polymer removal liquid.

11. A substrate processing apparatus that removes a reaction product formed by deterioration of a resist and/or a thin film attached to a substrate by a removal liquid for said reaction product, said apparatus comprising:

an indexer part that mounts a cassette encasing a substrate and that loads and unloads a substrate with respect to the exterior of said apparatus;

a transport path, one end of which is in contact with said indexer part;

a plurality of removal processing units surrounding said transport path and performing a removal processing comprising removing said reaction product, each of said plurality of removal processing units including a holding part for holding a single substrate in a substantially horizontal position while rotating said single substrate and a removal liquid supply part for supplying said removal liquid to a surface of said single substrate held by said holding part;

a plurality of dry processing units surrounding said transport path and drying a substrate, each of said plurality of dry processing units including a temperature controlled plate for receiving said substrate thereon for heating, a sealed chamber that is airtight for housing said temperature controlled plate and a pressure reduction part for reducing the pressure within said sealed chamber; and a transport robot being disposed on said transport path and transporting a substrate among said indexer part, said plurality of removal processing units, and said plurality of dry processing units, wherein said plurality of removal processing units are disposed below said plurality of dry processing units, respectively.

12. The substrate processing apparatus according to claim 11 further comprising:

organic solvent vapor generating units being disposed laterally to said plurality of dry processing units, respectively, and supplying an organic solvent vapor to said plurality of dry processing units.

13. The substrate processing apparatus according to claim 12 wherein said transport robot has a telescopic lifting mechanism performing a lifting action by telescopic motion of a telescopic motion body.

14. The substrate processing apparatus according to claim 13 wherein said reaction product is polymer formed by one of ashing and dry etching, and said removal liquid is a polymer removal liquid.

15. A substrate processing apparatus that removes a reaction product formed by deterioration of a resist and/or a thin film attached to a substrate by a removal liquid for said reaction product, said apparatus comprising:

a removal processing part formed by disposing in a multistage a plurality of removal processing units for performing a removal processing comprising removing said reaction product, each of said plurality of removal processing units including a holding part for holding a single substrate in a substantially horizontal position while rotating said single substrate and a removal liquid supply part for supplying said removal liquid to a surface of said single substrate held by said holding part;

a dry processing part formed by disposing in a multistage a plurality of dry processing units for drying a substrate, each of said plurality of dry processing units including a temperature controlled plate for receiving said substrate thereon for heating, a sealed chamber that is airtight for housing said temperature controlled plate and a pressure reduction part for reducing the pressure within said sealed chamber; and a transport robot for transporting a substrate among said plurality of removal processing units and said plurality of dry processing units, wherein said removal processing part and said dry processing part are disposed around said transport robot.

16. The substrate processing apparatus according to claim 15 wherein said transport robot has a telescopic lifting mechanism performing a lifting action by telescopic motion of a telescopic motion body.

17. The substrate processing apparatus according to claim 16 wherein said reaction product is polymer formed by one of ashing and dry etching, and said removal liquid is a polymer removal liquid.

* * * * *